(12) United States Patent
Elsherbini et al.

(10) Patent No.: US 11,508,587 B2
(45) Date of Patent: Nov. 22, 2022

(54) MICROELECTRONIC ASSEMBLIES

(71) Applicant: Intel Corporation, Santa Clara, CA (US)

(72) Inventors: Adel A. Elsherbini, Chandler, AZ (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 16/648,645

(22) PCT Filed: Dec. 29, 2017

(86) PCT No.: PCT/US2017/068899
§ 371 (c)(1),
(2) Date: Mar. 18, 2020

(87) PCT Pub. No.: WO2019/132955
PCT Pub. Date: Jul. 4, 2019

(65) Prior Publication Data
US 2020/0286745 A1    Sep. 10, 2020

(51) Int. Cl.
*H01L 21/48*    (2006.01)
*H01L 23/538*    (2006.01)
(Continued)

(52) U.S. Cl.
CPC ........ *H01L 21/4857* (2013.01); *H01L 21/486* (2013.01); *H01L 23/5383* (2013.01);
(Continued)

(58) Field of Classification Search
CPC ............... H01L 21/4857; H01L 21/486; H01L 23/5383; H01L 23/5384; H01L 29/66007;
(Continued)

(56) References Cited

U.S. PATENT DOCUMENTS

2007/0298543 A1 * 12/2007 Su .................... H01L 33/0093
438/122
2008/0048309 A1    2/2008 Corisis et al.
(Continued)

FOREIGN PATENT DOCUMENTS

DE    102008040906 A1    2/2010
KR    1020100006946 A    1/2010
(Continued)

OTHER PUBLICATIONS

PCT International Search Report and Written Opinion of PCT/US2017/068899 dated Sep. 28, 2018; 14 pages.

*Primary Examiner* — Wasiul Haider
(74) *Attorney, Agent, or Firm* — Akona IP PC

(57) ABSTRACT

Microelectronic assemblies, and related devices and methods, are disclosed herein. For example, in some embodiments, a microelectronic assembly may include a package substrate having a first surface and an opposing second surface; and a die embedded in the package substrate, wherein the die has a first surface and an opposing second surface, the die has first conductive contacts at the first surface and second conductive contacts at the second surface, and the first conductive contacts and the second conductive contacts are electrically coupled to conductive pathways in the package substrate.

8 Claims, 31 Drawing Sheets

(51) Int. Cl.
*H01L 29/66* (2006.01)
*H05K 3/30* (2006.01)

(52) U.S. Cl.
CPC .... *H01L 23/5384* (2013.01); *H01L 29/66007* (2013.01); *H05K 3/303* (2013.01)

(58) Field of Classification Search
CPC ... H01L 2224/214; H01L 24/25; H01L 24/19; H01L 23/49816; H01L 2224/04105; H01L 2224/06181; H01L 2224/08225; H01L 2224/12105; H01L 2224/24137; H01L 2224/2518; H01L 2224/80006; H01L 2924/13091; H01L 2924/1421; H01L 2924/1432; H01L 2924/15153; H01L 2924/15192; H01L 2924/15311; H01L 2924/15313; H01L 2924/15333; H01L 21/4871; H01L 23/4334; H01L 23/473; H01L 23/5389; H01L 23/44–4735; H01L 23/34–4338; H01L 23/46; H01L 2023/405; H05K 3/303

See application file for complete search history.

(56) References Cited

U.S. PATENT DOCUMENTS

| | | |
|---|---|---|
| 2008/0079144 A1 | 4/2008 | Tang et al. |
| 2010/0295170 A1* | 11/2010 | Komura ................. H01L 24/05 |
| | | 257/700 |
| 2011/0045634 A1 | 2/2011 | Pagaila |
| 2013/0009325 A1* | 1/2013 | Mori ..................... H05K 1/185 |
| | | 438/118 |
| 2013/0023088 A1 | 1/2013 | Nalla et al. |
| 2016/0293497 A1* | 10/2016 | Eckert ..................... H01L 22/20 |
| 2018/0090417 A1* | 3/2018 | Gutala ................ H01L 23/3675 |

FOREIGN PATENT DOCUMENTS

| | | |
|---|---|---|
| KR | 1020110111232 A | 10/2011 |
| WO | 2017161199 A1 | 9/2017 |
| WO | 2019132955 A1 | 7/2019 |

\* cited by examiner

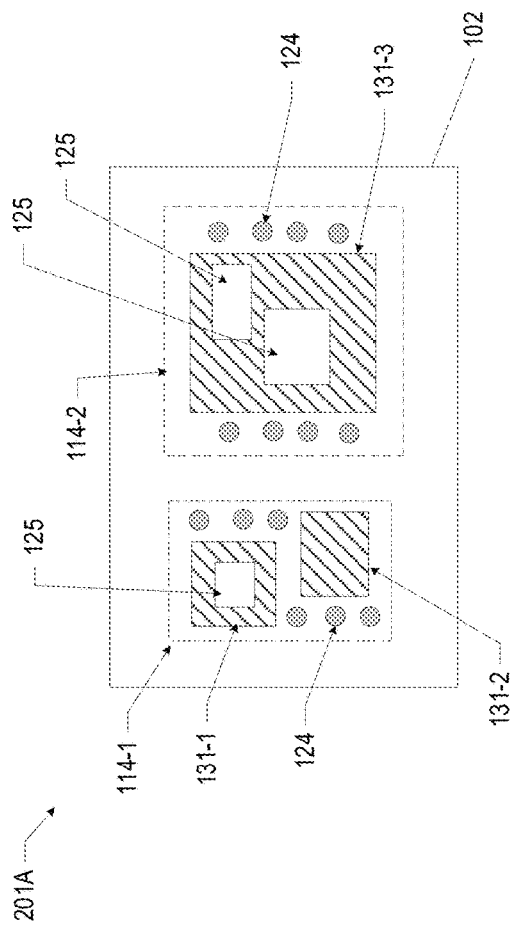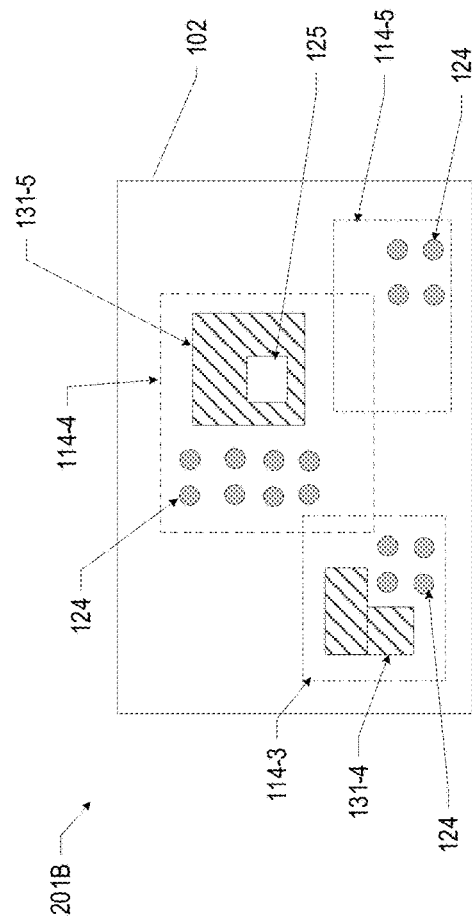

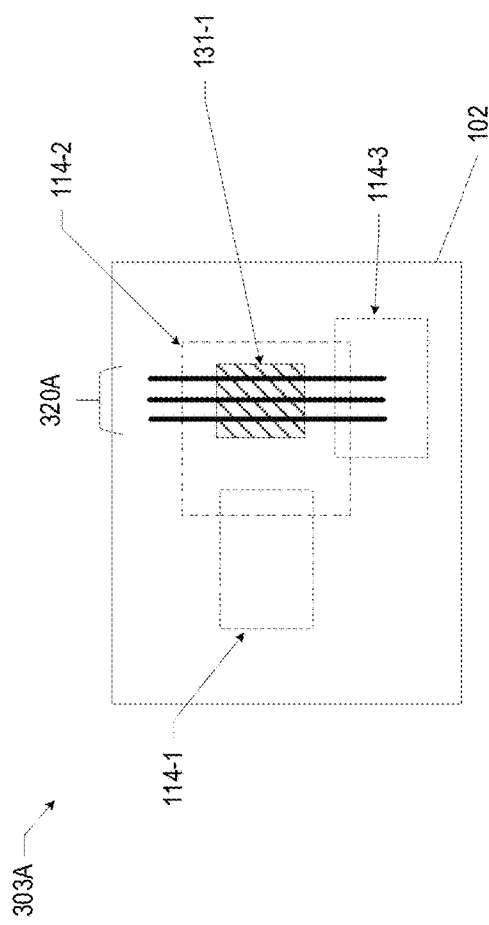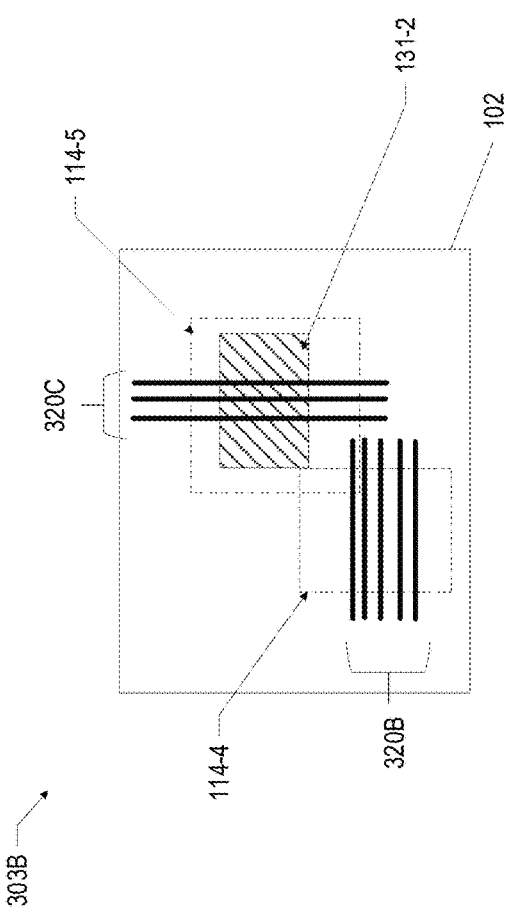

MICROELECTRONIC ASSEMBLIES

CROSS-REFERENCE TO RELATED APPLICATION

This application is a national stage application under 35 U.S.C. § 371 of PCT International Application Serial No. PCT/US2017/068899, filed on Dec. 29, 2017 and entitled "MICROELECTRONIC ASSEMBLIES," which is hereby incorporated by reference herein in its entirety.

BACKGROUND

Integrated circuit devices (e.g., dies) are conventionally coupled to a package substrate for mechanical stability and to facilitate connection to other components, such as circuit boards. The interconnect pitch achievable by conventional substrates is constrained by manufacturing, materials, and thermal considerations, among others.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2B-2C are top views of example microelectronic assemblies having an embedded double-sided die and a heat spreader, in accordance with various embodiments.

FIGS. 3C and 3D are top views of example microelectronic assemblies having embedded double-sided dies and channels, in accordance with various embodiments.

DETAILED DESCRIPTION

Figure 1A:
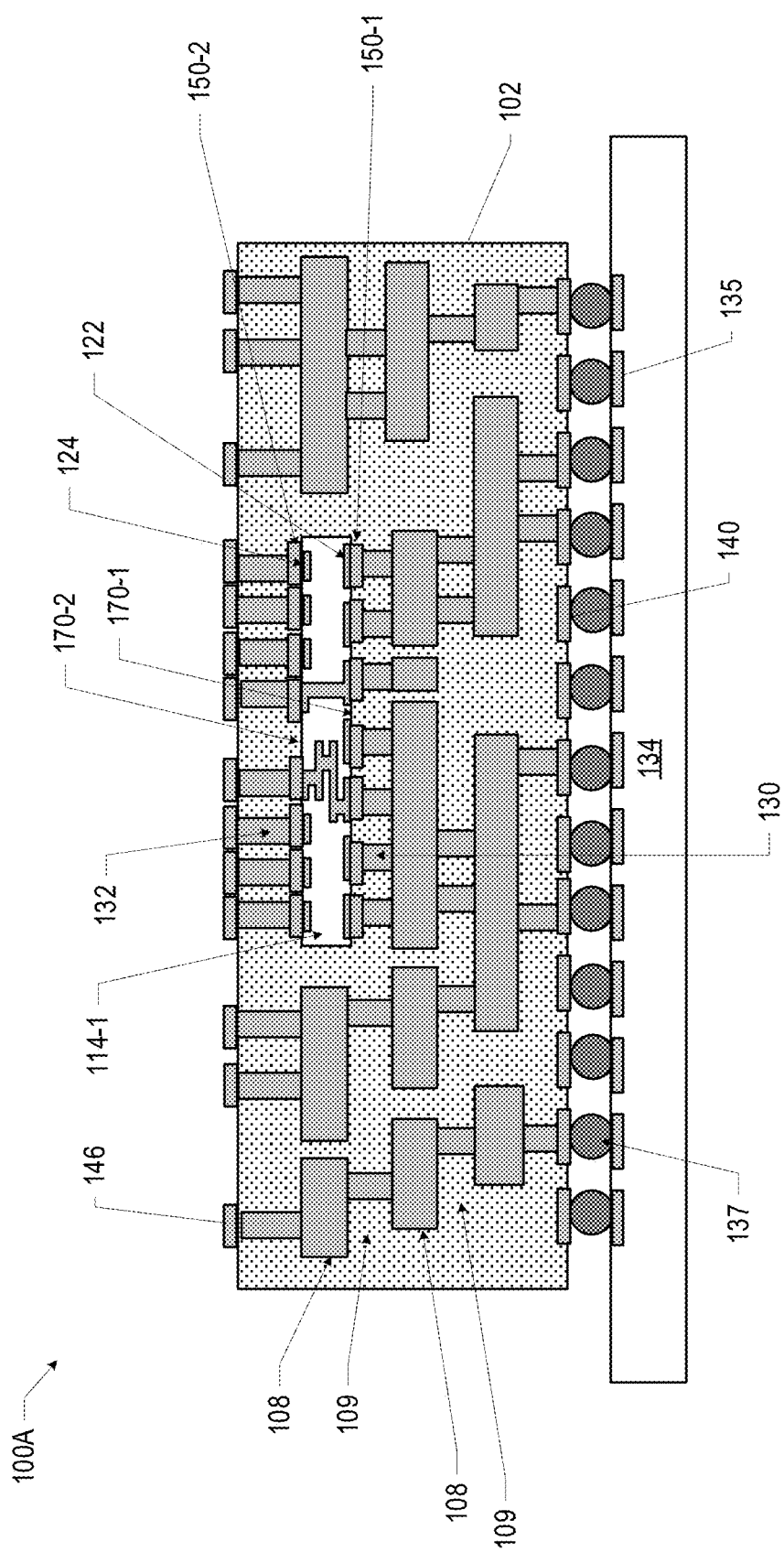
FIGS. 1A-1C are side, cross-sectional views of an example microelectronic assembly having an embedded double-sided die, in accordance with various embodiments.

Microelectronic assemblies, and related devices and methods, are disclosed herein. For example, in some embodiments, a microelectronic assembly may include a package substrate having a first surface and an opposing second surface; and a die having a first surface with first conductive contacts and an opposing second surface having second conductive contacts, wherein the die is embedded in the package substrate, and wherein the first conductive contacts at the first surface and second conductive contacts at the second surface are coupled to conductive pathways in the package substrate. In some embodiments, a microelectronic assembly may further include a heat spreader on the second surface of the embedded die.

In some embodiments, a microelectronic assembly may include a package substrate having a plurality of dielectric and conductive layers; a die having a first surface with first interconnects and an opposing second surface having second interconnects, wherein the die is embedded in the package substrate, and wherein the first interconnects and the second interconnects are coupled to conductive pathways in the package substrate; a heat spreader on the second surface of the die; and a channel in thermal contact with the second surface of the die, wherein the channel is a hollow structure comprising a fluid that flows through the channel.

Communicating large numbers of signals in an integrated circuit (IC) package is challenging due to the increasingly small size of IC dies, thermal constraints, and power delivery constraints, among others. This becomes even more challenging when IC dies are embedded in the package substrate. Various ones of the embodiments disclosed herein may help achieve reliable attachment of double-sided IC dies (i.e., dies having first interconnects on a first surface and second interconnects on an opposing second surface, may also be referred to herein as a multi-strata transistor) that are embedded within an IC package substrate at a lower cost, with improved power efficiency, with higher bandwidth, and/or with greater design flexibility, relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

One of the main drivers for package design rules is the input/output (I/O) density per mm per layer (IO/mm/layer). For example, the I/O density may be limited by the via pad sizes, which may be defined by manufacturing tolerances of conventional packaging technologies. In some conventional manufacturing processes, such as laser drilling, the via pads are likely to be relatively large. Laser drilling is limited by the minimum feature size and the misalignment of the laser when drilling the via opening. For example, the minimum feature size of a laser drilled via opening may be approximately 40 μm or larger when a $CO_2$ laser is used, and the misalignment between the layers may be approximately +/−15 μm or larger. As such, the via pad sizes may be approximately 70 μm (i.e., 40+2(15) μm) or larger in some conventional technologies. Alternative laser sources, such as ultraviolet (UV) lasers, may be able to reduce the via opening more, but throughput may also be decreased. Accordingly, some embodiments disclosed herein may utilize one or more processes that form the vias with lithographic processes instead of with lasers. The use of lithographic processes allows for an improved layer-to-layer alignment and smaller pads compared to laser drilling, which in turn results in higher I/O densities. Additionally, the throughput time is deceased with lithography-based processes because all of the vias may be formed at once (i.e., a single exposure and patterning) instead of being formed sequentially when laser drilling is used.

Furthermore, the use of lithography-based processes to form the vias allows for the vias to be formed in any desire shape. Instead of being limited to the shape of the laser, a lithographically defined via may be customized for a desired purpose. For example, whereas a laser defined via may be limited to a circular shape, some embodiments may include vias that are rectangular in shape and extend in lateral direction along the routing line.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 7" may be used to refer to the collection of drawings of FIGS. 7A-7B, the phrase "FIG. 8" may be used to refer to the collection of drawings of FIGS. 8A-8E, etc. although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1A is a side, cross-sectional view of a microelectronic assembly 100A, in accordance with various embodiments. The microelectronic assembly 100A may include a package substrate 102 having a double-sided die 114-1 embedded in a conductive layer 108. In particular, the top surface of die 114-1 may include a set of conductive contacts 124 and the bottom surface of die 114-1 may include a set of conductive contacts 122. The conductive contacts 122 at the bottom surface of the die 114-1 may be electrically coupled to conductive pathways 130 within the package substrate via interconnects 150-1, and the conductive contacts 124 on the top surface 170-2 of the die 114-1 may be electrically coupled to conductive pathways 132 within the package substrate via interconnects 150-2. Any of the conductive contacts disclosed herein (e.g., the conductive contacts 122, 124 and/or 150) may include padless traces and/or padless vias, or any other suitable thin stand-off height techniques, such as, for example, an anisotropic conductive material (e.g., anisotropic conductive film (ACF)), die attach film (DAF), ultra-small stand-off height solder with non-conductive film (NCF), and metal-to-metal interconnects, among others. In some metal-to-metal interconnects that utilize hybrid bonding, a dielectric material (e.g., silicon oxide, silicon nitride, or silicon carbide) may be present between the metals bonded together (e.g., between copper pads or posts that provide the associated conductive contacts 124). Metal-to-metal interconnects may be capable of reliably conducting a higher current than other types of interconnects; for example, some solder interconnects may form brittle intermetallic compounds over time when current flows, and the maximum current provided through such interconnects may be constrained to mitigate mechanical failure.

Die 114-1 may have a thickness that is approximately equal to a thickness of the conductive layer 108 in which die 114-1 is embedded. For example, the conductive layer 108 may be patterned to include a cavity for embedding the die 114-1, and the conductive layer thickness (and cavity depth) may be formed to match the thickness of the double-sided die 114-1. In some embodiments, die 114-1 is an ultra-thin die. In some embodiments, die 114-1 may have a thickness between 5 microns (um) and 50 um. In some embodiments, the conductive layer 108 may have a thickness between 5 um and 50 um. In some embodiments, the conductive layer 108 may have a thickness that is greater than a thickness of an embedded die. For example, in some embodiments, the conductive layer 108 may have a thickness between 10 um and 100 um, and die 114-1 may have a thickness of between 10 um and 50 um. In some embodiments, the conductive layer 108 may have a thickness that is less than a thickness of an embedded die. For example, in some embodiments, the conductive layer 108 may have a thickness between 10 um and 100 um, and die 114-1 may have a thickness between 200 um and 500 um.

The package substrate 102 may include an insulating material (e.g., e.g., a dielectric material formed in multiple layers, as known in the art) and one or more conductive pathways through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The conductive pathways in the package substrate 102 may be bordered by liner materials, such as adhesion liners and/or barrier liners, as suitable.

As shown in FIG. 1A, package substrate 102 may include conductive layers 108 that alternate with dielectric layers 109. Conductive layer 108 and dielectric layer 109 may include a single layer or may include multiple layers, for example, conductive layer 108 may include a seed layer and a patterned trace layer. In some embodiments, conductive layer 108 may be a patterned trace layer. In some embodiments, conductive layer 108 may be a continuous layer.

In some embodiments, one or more of the conductive pathways in the package substrate 102 may extend between a conductive contact 146 at the top surface of the package substrate 102 and a conductive contact 140 at the bottom surface of the package substrate 102. In some embodiments, one or more of the conductive pathways 130 in the package substrate 102 may extend between a conductive contact 122 at the bottom of the embedded die 114-1 and a conductive contact 140 at the bottom surface of the package substrate 102. In some embodiments, one or more of the conductive pathways 132 in the package substrate 102 may extend between a conductive contact 124 at the top of the embedded die 114-1 and a conductive contact 146 at the top surface of the package substrate 102. In some embodiments, one or more of the conductive pathways in the package substrate 102 may extend between different conductive contacts 146 at the top surface of the package substrate 102, and may extend between different conductive contacts 146 via the embedded die 114-1. In some embodiments, one or more of the conductive pathways in the package substrate 102 may extend between different conductive contacts 140 at the bottom surface of the package substrate 102, and may extend between different conductive contacts 140 via the embedded die 114-1.

The microelectronic assembly of FIG. 1A may also include a circuit board 134. The package substrate 102 may be coupled to the circuit board 134 by second-level interconnects 137 at the bottom surface of the package substrate 102. In particular, the package substrate 102 may include conductive contacts 140 at its bottom surface, and the circuit board 134 may include conductive contacts 135 at its top surface; the second-level interconnects 137 may electrically and mechanically couple the conductive contacts 135 and the conductive contacts 140. The second-level interconnects 137 illustrated in FIG. 1A are solder balls (e.g., for a ball grid array arrangement), but any suitable second-level interconnects 137 may be used (e.g., pins in a pin grid array arrangement or lands in a land grid array arrangement). The circuit board 134 may be a motherboard, for example, and may have other components attached to it (not shown). The circuit board 134 may include conductive pathways and other conductive contacts (not shown) for routing power, ground, and signals through the circuit board 134, as known in the art. In some embodiments, the second-level interconnects 137 may not couple the package substrate 102 to a circuit board 134, but may instead couple the package substrate 102 to another IC package, an interposer, or any other suitable component.

A number of elements are illustrated in FIG. 1 as included in the microelectronic assemblies 100, but a number of these elements may not be present in microelectronic assemblies 100. For example, in various embodiments, the second-level interconnects 137, and/or the circuit board 134 may not be included. Further, FIG. 1 illustrates a number of elements that are omitted from subsequent drawings for ease of illustration, but may be included in any of the microelectronic assemblies 100 disclosed herein. Examples of such elements include the second-level interconnects 137, and/or the circuit board 134. Many of the elements of the microelectronic assemblies 100 of FIG. 1 are included in other ones of the accompanying figures; the discussion of these elements is not repeated when discussing these figures, and any of these elements may take any of the forms disclosed herein. A number of elements are not illustrated in FIG. 1, but may be present in microelectronic subassemblies 100, for example, additional active components, such as dies, or additional passive components, such as surface-mount resistors, capacitors, and/or inductors, may be disposed on the top surface or the bottom surface of the package substrate 102, or embedded in the package substrate 102, and may be electrically connected to embedded dies 114.

The die 114-1 disclosed herein may include a semiconductor layer with active devices patterned on it (e.g. transistors, diodes, etc.), an insulating material (e.g., a dielectric material formed in multiple layers, or semiconductor material, as known in the art) and multiple conductive pathways formed through the insulating material. In some embodiments, the insulating material of a die 114 may include a dielectric material, such as silicon dioxide, silicon nitride, BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). For example, the die 114 may include a dielectric build-up film, such as Ajinomoto build-up film (ABF). In some embodiments, the insulating material of die 114 may be a semiconductor material, such as silicon, germanium, or a III-V material. In some embodiments, the die 114-1 may include silicon. The conductive pathways in die 114-1 may include conductive traces and/or conductive vias, and may connect any of the conductive contacts in the die 114-1 and any suitable manner (e.g., connecting multiple conductive contacts on a same surface or on different surfaces of the die 114-1). In some embodiments, die 114-1 is a double-sided die. Example structures that may be included in die 114-1 disclosed herein are discussed below with reference to FIG. 11. The conductive pathways in the die 114-1 may be bordered by liner materials, such as adhesion liners and/or barrier liners, as suitable.

Figure 1B:
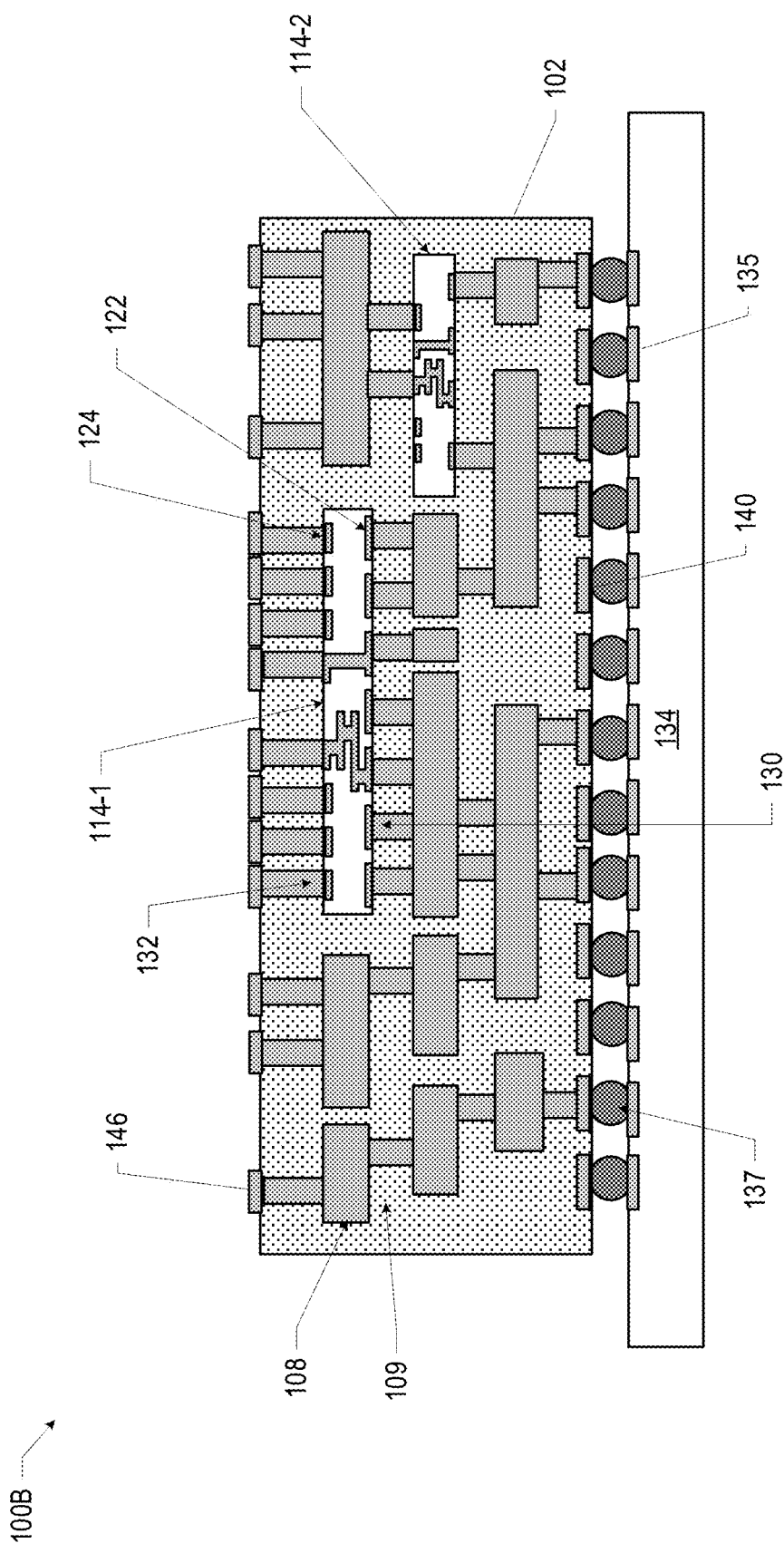
Figure 1C:
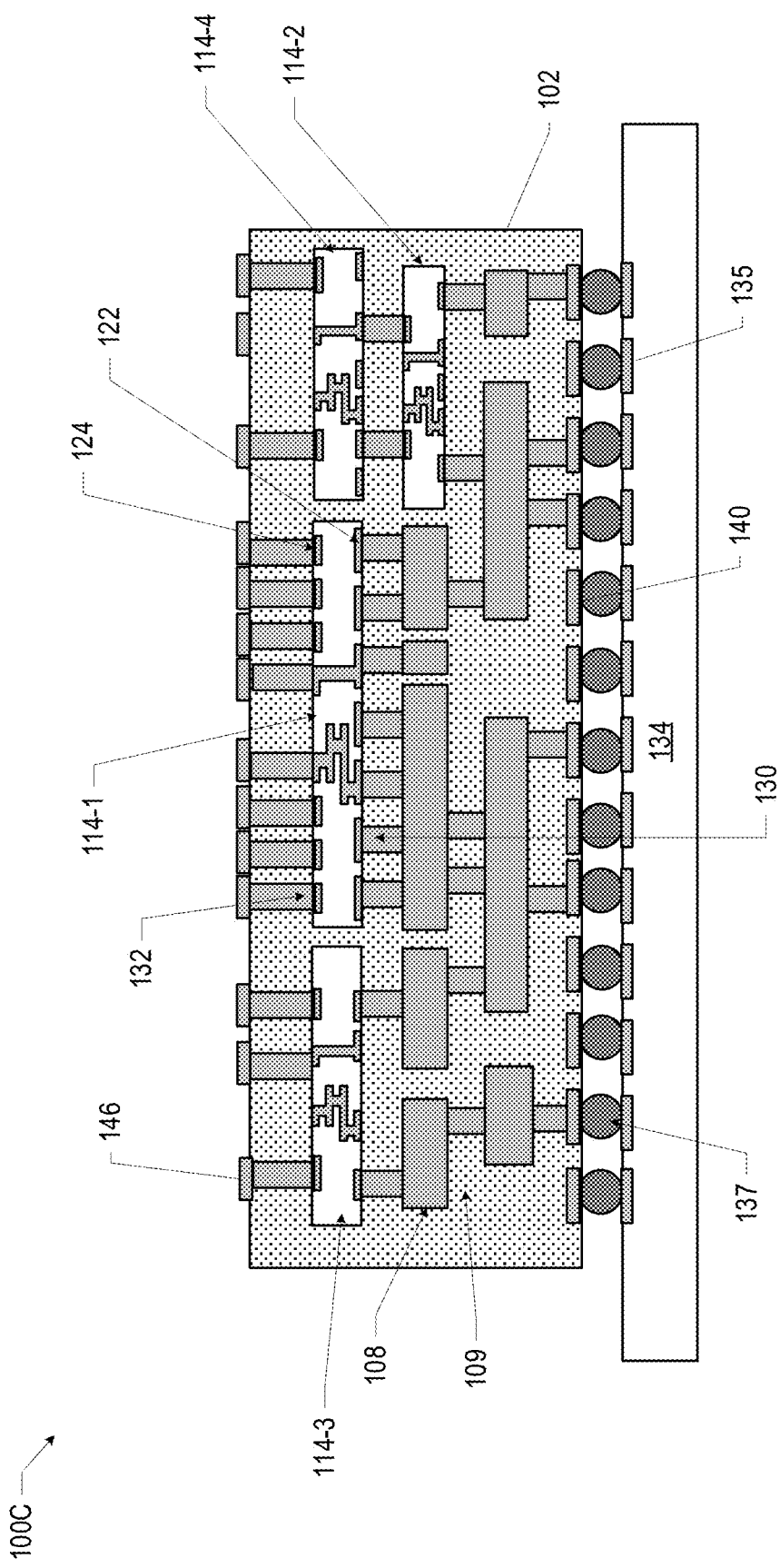

FIGS. 1B and 1C are side, cross-sectional views of microelectronic assemblies 100B and 100C having a plurality of embedded double-sided dies, in accordance with various embodiments. The microelectronic assembly 100B may include a package substrate 102 having die 114-1 and a second die 114-2. Die 114-2 may be in any conductive layer. For example, embedded die 114-2 may be in a conductive layer below die 114-1, as depicted in FIG. 1B. The microelectronic assembly 100C may include a package substrate 102 having die 114-1, die 114-2, and dies 114-3 and 114-4. Dies 114-3, 114-4 may be in any conductive layer. In some embodiments, dies 114-3, 114-4 may be in the same conductive layer as each other and in the same conductive layer as die 114-1, as depicted in FIG. 1C, may be in a conductive layer below die 114-1 as with die 114-2, or may be in a conductive layer on top of die 114-1 (not shown).

In some embodiments, die may include conductive pathways to route power, ground, and/or signals to/from the die to other dies that may be included in the microelectronic assembly. For example, the die 114-2 may include through-silicon vias (TSVs, including a conductive material via, such as a metal via, isolated from surrounding silicon by a barrier oxide) or other conductive pathways through which power, ground, and/or signals may be transmitted between the package substrate 102 and one or more dies "on top" of the die 114-2 (e.g., in the embodiment of FIG. 1C, the die 114-1, the die 114-3 and/or the die 114-4). In some embodiments, the dies may include conductive pathways to route power, ground, and/or signals between different ones of the dies on the top surface of the package substrate 102 (not shown). In some embodiments, the die may be the source and/or destination of signals communicated between the die and other dies included in the microelectronic assembly. In some embodiments, the die may couple directly to power and/or ground lines in the package substrate 102. By allowing the die to couple directly to power and/or ground lines in the package substrate 102, such power and/or ground lines may not be routed through the die, allowing the die to be made smaller or to include more active circuitry or signal pathways.

In some embodiments, the die may only include conductive pathways, and may not contain active or passive circuitry. In other embodiments, the die may include active or passive circuitry (e.g., transistors, diodes, resistors, inductors, and capacitors, among others). In some embodiments, the die may include one or more device layers including transistors (e.g., as discussed below with reference to FIG. 11). When the die includes active circuitry, power and/or ground signals may be routed through the package substrate 102 and to the die through the conductive contacts on the top or bottom surface of the die.

Although FIG. 1 illustrates a specific number and arrangement of conductive pathways in the package of 102 and/or one or more of the dies 114, these are simply illustrative and any suitable number and arrangement may be used. The conductive pathways disclosed herein (e.g., conductive traces and/or conductive vias) may be formed of any appropriate conductive material, such as copper, silver, nickel, gold, aluminum, or other metals or alloys, for example.

In some embodiments, the package substrate 102 may be a lower density medium and the die 114-1 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. For example, in some embodiments, a higher density medium (e.g., the die 114-1) may have a line or space pitch of approximately 10 microns, while a lower density medium (e.g., the package substrate 102) may have a line or space pitch of approximately 40-50 microns. In some embodiments, a higher density medium may have a line or space pitch of less than 20 microns, while a lower density medium may have a line or space pitch greater than 40 microns. In some embodiments, a higher density medium may have a line or space pitch less than 100 microns, while a lower density medium may have a line or space pitch greater than 100 microns (e.g., greater than 200 microns). In some embodiments, a higher density medium may be manufactured using a modified semi-additive process or a semi-additive build-up process with advanced lithography (with small vertical interconnect features formed by advanced laser or lithography processes), while a lower density medium may be a printed circuit board (PCB) manufactured using a standard PCB process (e.g., a standard subtractive process using etch chemistry to remove areas of unwanted copper, and with coarse vertical interconnect features formed by a standard laser process).

In some embodiments, individual ones of the microelectronic assemblies 100 disclosed herein may serve as a system-in-package (SiP) in which multiple embedded dies 114 having different functionality are included. In such embodiments, the microelectronic assembly 100 may be referred to as an SiP.

The elements of the microelectronic assembly 100 may have any suitable dimensions. For example, in some embodiments, a thickness of the package substrate 102 may be between 0.25 millimeters and 3 millimeters (e.g., between 0.25 millimeters and 2 millimeters, between 0.4 millimeters and 0.6 millimeters, or approximately 0.5 millimeters).

Although FIG. 1 depicts a limited number of the dies 114, the microelectronic assemblies 100 disclosed herein may have any suitable number of the dies 114. More generally, the microelectronic assemblies 100 disclosed herein may have any suitable arrangement of the dies 114 and any number of the dies 114 may be double-sided dies. FIGS. 1D and 1E are top views of example arrangements of multiple dies 114 embedded in package substrate 102 in various microelectronic assemblies 100, in accordance with various embodiments. In the arrangements of FIGS. 1D and 1E, the different dies 114 may include any suitable circuitry. For example, in some embodiments, the die 114 may be an active or passive die, and the dies 114 may include input/output circuitry, high bandwidth memory, enhanced dynamic random access memory (EDRAM).

Figure 1D:
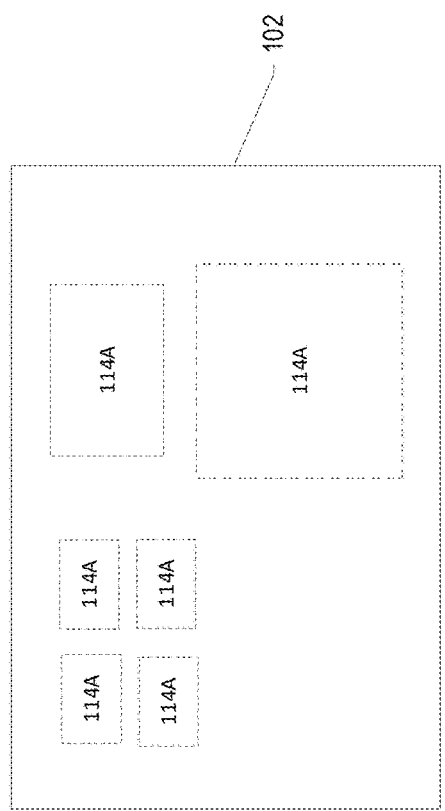
FIGS. 1D-1E are top views of example microelectronic assemblies, in accordance with various embodiments.

FIG. 1D illustrates an arrangement in which embedded dies 114A do not overlap in the package substrate 102. In FIG. 1D, the dies 114A are arranged such that the embedded dies are not stacked and are spaced apart from each other. In some embodiments, dies 114A may be embedded in the same conductive layer. In some embodiments, some or all of dies 114A may be embedded in different conductive layers.

Figure 1E:
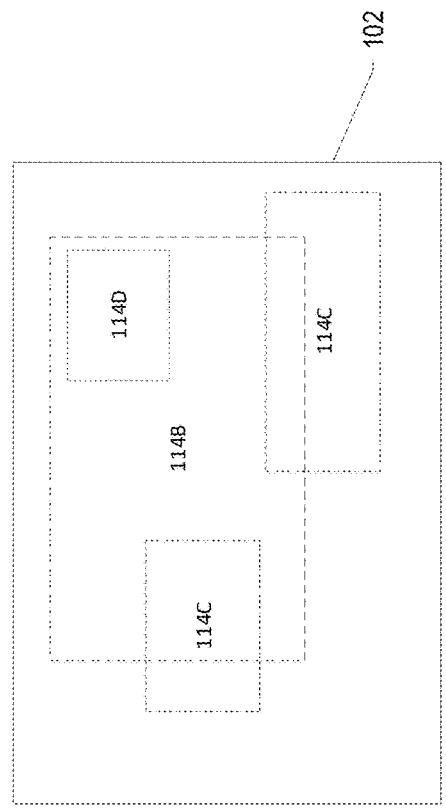

FIG. 1E illustrates an arrangement in which embedded dies 114B, 114C, 114D overlap in the package substrate 102. In FIG. 1E, the dies 114C "overlap" the edges and/or the corners of the die 114B, while the die 114D is wholly within the footprint or area of the die 114B. Placing dies 114C at least partially over the corners of the die 114B may reduce routing congestion in the die 114B and may improve utilization of the die 114B (e.g., in case the number of input/outputs needed between the die 114B and the dies 114C is not large enough to require the full edge of the die 114B). In some embodiments, the dies 114C and the die 114D may be embedded in the same conductive layer, and the die 114B embedded in a different conductive layer. In some embodiments, the die 114B, the dies 114C, and the die 114D may be embedded in a different conductive layer.

Figure 2A:
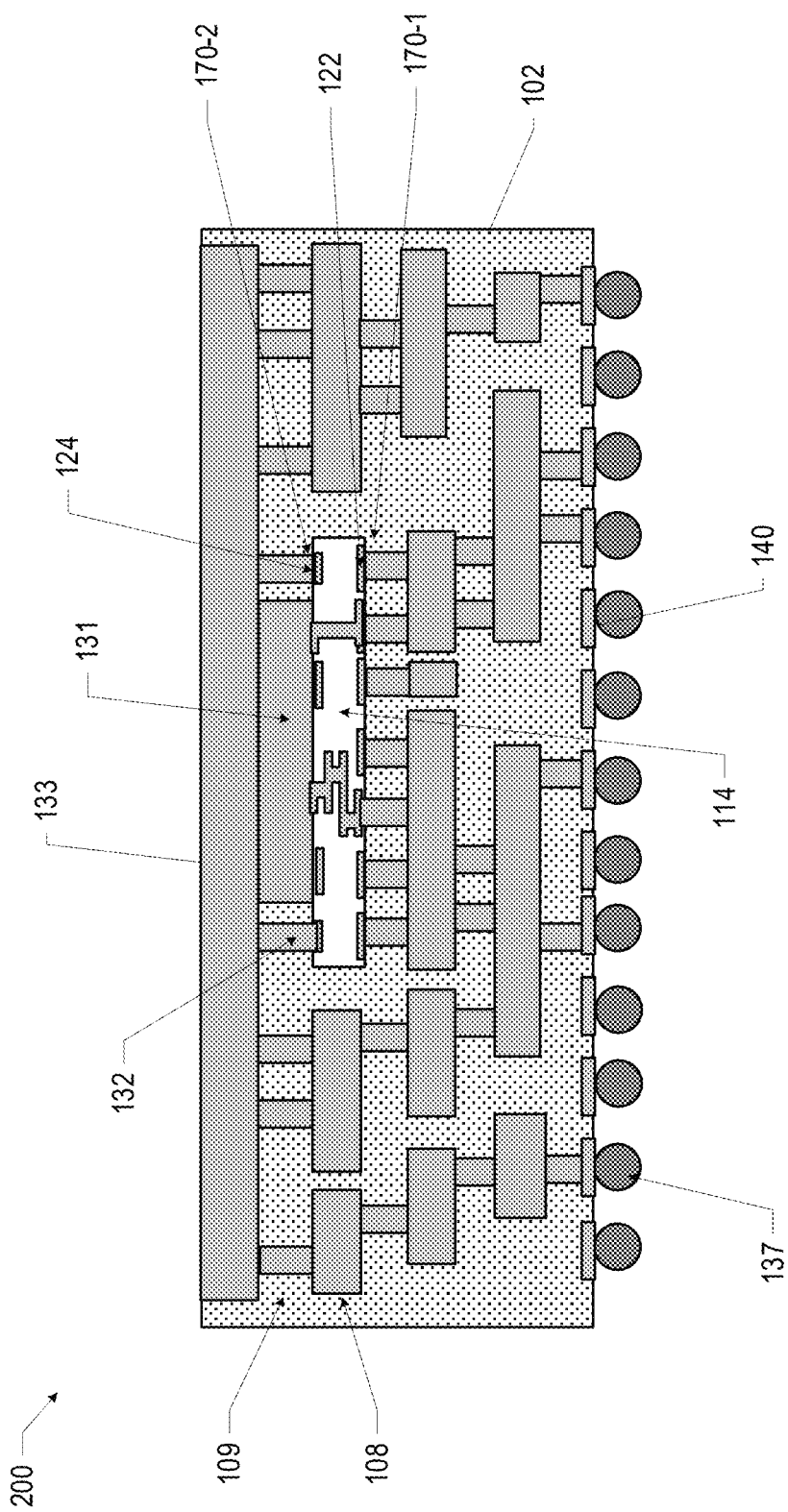
FIG. 2A is a side, cross-sectional view of an example microelectronic assembly having an embedded double-sided die and a heat spreader, in accordance with various embodiments.

FIG. 2A is a side, cross-sectional view of a microelectronic assembly 200, in accordance with various embodiments. The microelectronic assembly 200 may include a package substrate 102 having a double-sided die 114 embedded in a conductive layer 108, and a heat spreader 131 that may be integrated into a dielectric layer 109 of package substrate 102. The heat spreader 131 may be used to move heat away from the die 114 (e.g., so that the heat may be more readily spread). Microelectronic assembly 200 may further include a conductive plane 133 in thermal contact with the heat spreader 131 to more efficiently dissipate heat from the die 114. The heat spreader 131 may move heat vertically from the die and the conductive plane 133 may move heat laterally. The heat spreader 131 and the conductive plane 133 may include any suitable thermally conductive material (e.g., metal, appropriate ceramics, etc.), and may include any suitable features (e.g., fins). The heat spreader 131 and/or the conductive plane 133 may also serve an electrical function, such as being connected to a ground plane, or may be a floating plane. The heat spreader 131 and the conductive plane 133 may be formed using lithographic techniques for forming vias.

The heat spreader 131 may be any suitable size and shape. In some embodiments, the size and shape of the heat spreader 131 may depend on the type of die. For example, in high power dies (e.g., power delivery dies), the heat spreader 131 may be formed as a copper block that substantially covers the second surface of the die 114. In some embodiments, the heat spreader 131 may have a thickness of 10 um to 200 um. In some embodiments, the heat spreader 131 may have a thickness that is equal to a thickness of a via 132.

The conductive plane 133 may be any suitable size and shape. In some embodiments, the size and shape of the conductive plane 133 may depend on the dimensions, conductive pathways, or embedded structures of the package substrate. In some embodiments, the conductive plane 133 may have a thickness of 10 um to 200 um. In some embodiments, the heat spreader 131 may have a thickness that is equal to a thickness of a conductive layer. In some embodiments, the conductive plane 133 is more than 50% of the surface area of a conductive layer 108. In some embodiments, the conductive plane 133 is less than 50% of the surface area of the conductive layer 108. In some embodiments, more than one heat spreader may be in thermal contact with the conductive plane 133.

The heat spreader may be limited in size and shape by the die 114 as the heat spreader 131 is in contact with the top surface of the die 114. The top surface of die 114 may include a heat spreader 131, and conductive contacts 124. For example, the top surface of die 114 may include a first area for attaching a heat spreader 131, and a second area for attaching conductive contacts 124 that may be electrically coupled to conductive pathways 132 within the package substrate. The top surface of the die 114 may further include a third area that does not include conductive material instead the third area is subsequently laminated with dielectric. The third area may include die structures that are likely to be impacted by conductive material covering these structures (e.g., die inductors or transformers). For example, the heat spreader may be patterned to include a gap or open region that exposes underlying structures that may be laminated with dielectric. Examples of various heat spreader arrangements are depicted in more detail in FIGS. 2B and 2C.

FIGS. 2B and 2C are top views of example arrangements of embedded dies 114 having a heat spreader 131 in various microelectronic assemblies 201, in accordance with various embodiments. In FIG. 2B, microelectronic assembly 201A may include dies 114-1 and 114-2 embedded in package substrate 102. The die 114-1 may include the heat spreaders 131-1, 131-2, and the conductive contacts 124 on the top surface of the die 114-1. The heat spreader 131-1 may include a gap or open area 125 that does not include conductive material on the top surface of the die. The die 114-2 may include the heat spreader 131-3 and the conductive contacts 124. The heat spreader 131-3 may include one or more gaps 125 and may extend over or cover a substantial area of the die 114-2. As depicted in FIG. 2B, the dies 114-1 and 114-2 do not overlap such that dies 114-1 and 114-2 may be in the same conductive layer or may be in different conductive layers.

In FIG. 2C, microelectronic assembly 201B may include dies 114-3, 114-4, and 114-5 embedded in package substrate 102. The die 114-3 may include the heat spreader 131-4, and the conductive contacts 124 on the top surface of the die 114-3. The die 114-4 may include the heat spreader 131-5, and the conductive contacts 124 on the top surface of the die 114-4. The heat spreader 131-5 may include a gap 125 that does not include conductive material on the top surface of the die. The die 114-5 may include the conductive contacts 124 and may not include a heat spreader. As depicted in FIG. 2C, the dies 114-3, 114-4, and 114-5 overlap such that dies 114-3 and 114-5 may be in the same conductive layer as each other and in a different conductive layer from the die 114-4, or dies 114-3, 114-4, and 114-5 may be in different conductive layers from each other.

Although FIG. 2 depicts a heat spreader 131 and conductive plane 133 on a top surface of the die 114, the heat spreader and/or conductive plane may be on a bottom surface of the die. Further, although FIGS. 2B and 2C depict microelectronic assemblies including only a heat spreader and/or conductive contacts on the surface of the dies, other structures and connections may be included on the dies as well as within the microelectronic assemblies.

Figure 3A:
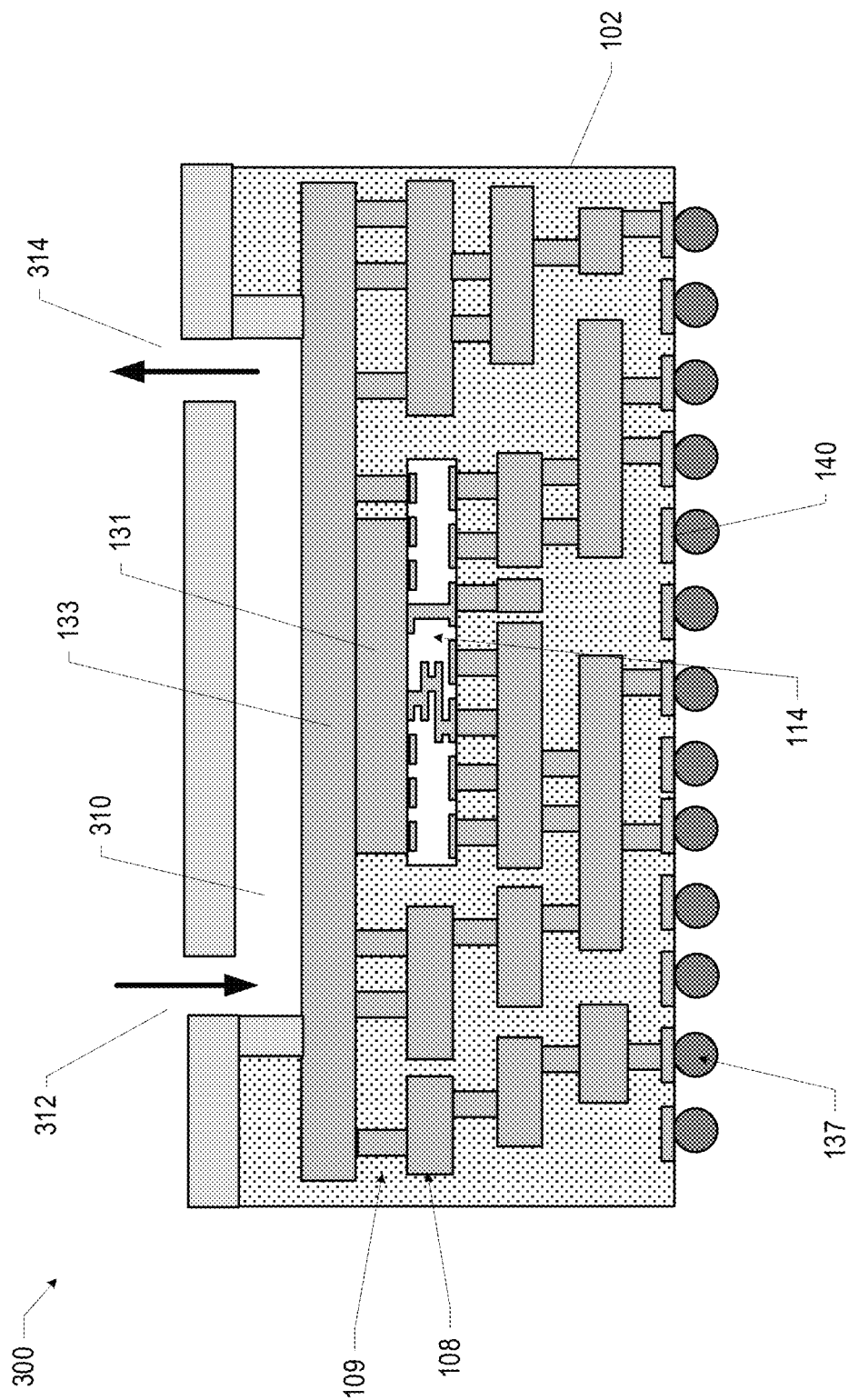
FIGS. 3A and 3B are side, cross-sectional views of example microelectronic assemblies having an embedded double-sided die and channels, in accordance with various embodiments.
Figure 3B:
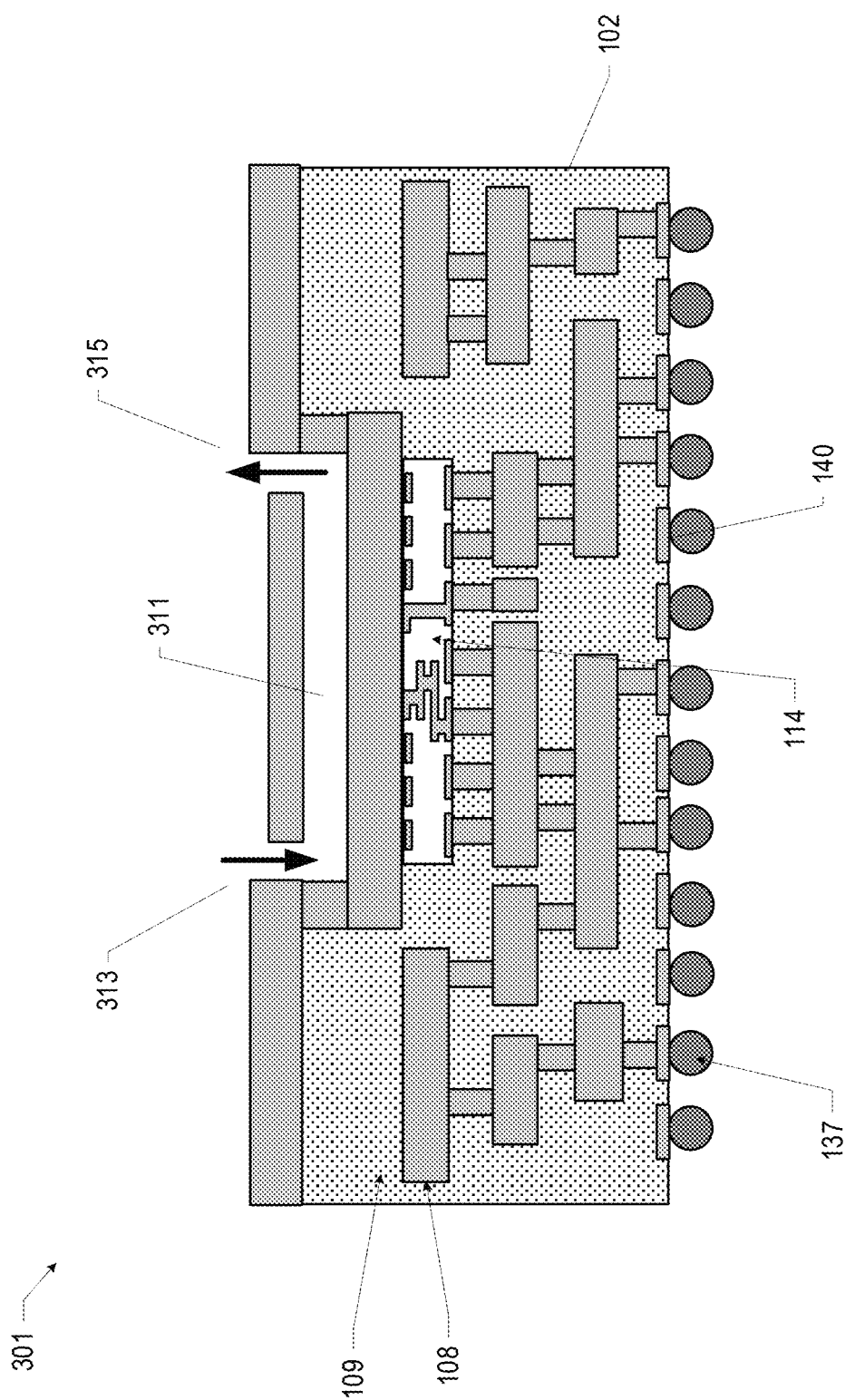

FIGS. 3A and 3B are side, cross-sectional views of example microelectronic assemblies having an embedded double-sided die, a heat spreader, and channels, in accordance with various embodiments. As shown in FIG. 3A, the microelectronic assembly 300 may include a package substrate 102 having a die 114 embedded in a conductive layer 108, a heat spreader 131 integrated into a dielectric layer 109 of package substrate 102, a conductive plane 133, and a channel 310. The channel may be in thermal contact with the heat spreader 131 and the conductive plane 133 to spread heat from the die 114. In particular, the channel may be a hollow structure filled with a fluid, such as a coolant, for example, water, fluorochemical liquids, silicone oil, ethylene glycol water, poly-alpha-olefin, or silicate ester, that may be circulated 312, 314, usually by a pump (not shown), to more efficiently dissipate heat from the die 114. The coolant may also include additives to prevent corrosion of the different components or to allow operation at higher/lower temperatures (e.g. additives to water to decrease its freezing point or increase its boiling point). The coolant used may depend on the coolant's properties, including viscosity and heat capacity, circulation flow rate, and the temperature rise during device operation. The channel 310 may include any suitable thermally conductive material (e.g., copper, appropriate ceramics, etc.). The channel 310 may be formed using any suitable techniques, including lithographic techniques for forming vias as described in more detail below with respect to FIG. 7. For example, the channel may be formed by creating a conductive channel within the dielectric layer, and boring out the dielectric material from the channel using reactive ion etching (RIE) or chemical etching. The channel 310 may be in any suitable layer. In FIG. 3A, the channel 310 is above the conductive plane 133 (i.e., one layer above the die). For a double-sided die, the channel 310 may be designed to be in thermal contact with heat generating areas of the die while allowing electrical connectivity on both sides of the die.

The channel 310 may be any suitable size and shape. In some embodiments, the channel 310 may have dimensions of 10 um to 200 um. In some embodiments, the channel may be a hollow tube. In some embodiments, the channel 310 may have a cross-section that is circular. In some embodiments, the channel 310 may have a cross-section that is rectangular or trapezoidal.

As shown in FIG. 3B, the microelectronic assembly 301 may include a package substrate 102 having a die 114 embedded in a conductive layer 108, and a channel 311. The channel may be in thermal contact with the die 114 to spread heat from the die 114. In particular, the channel 311 may be a hollow structure filled with a fluid, such as water, that may be circulated 313, 315, usually by a pump (not shown), to more efficiently dissipate heat from the die 114, as described above with reference to FIG. 3A. The channel 311 may include any suitable thermally conductive material, may be formed using any suitable technique, and may have any suitable size and shape as described above with reference to channel 310 in FIG. 3A. As described above, the channel 311 may be in any suitable layer. In FIG. 3B, the channel 311 is directly above the die 114 (i.e., one layer above the die). The channel 311 may be designed to be in direct thermal contact with a heat generating area of the die 114 while allowing electrical connectivity on both sides of the die.

FIGS. 3C and 3D are top views of example microelectronic assemblies having embedded double-sided dies and channels, in accordance with various embodiments. In FIG. 3C, microelectronic assembly 303A may include the dies 114-1, 114-2, and 114-3 embedded in package substrate 102. The die 114-2 may include a heat spreader 131-1 and the channels 320A. The dies 114-1, 114-2, and 114-3 overlap such that the dies 114-1 and 114-3 are in a different layer than the die 114-2. Channels 320A may be positioned in a layer above the die 114-2 as shown in FIG. 3A. In FIG. 3D, microelectronic assembly 303B may include the dies 114-4 and 114-5 embedded in package substrate 102. The die 114-4 may include the channels 320B. The die 114-2 may include a heat spreader 131-1 and the channels 320C. The dies 114-4 and 114-5 overlap such that the dies 114-4 and 114-5 are in a different layer in the package substrate 102. The channels 320B may be positioned directly on the die 114-4 as shown in FIG. 3B. The channels 320C may be positioned in a layer above the die 114-5 in the package substrate 102 as shown in FIG. 3A. The channels 320B and 320C, if not overlapping as shown in FIG. 3D, may be in the same layer or in may be in different layers of the package substrate 102. Although FIGS. 3C and 3D show the channels 320 has having only five channels or less, the channels 320 may have any suitable number of channels. The microelectronic assembly may have any suitable number of channels with any suitable number of channels, and in any suitable arrangement to move heat away from the dies.

Figure 4:
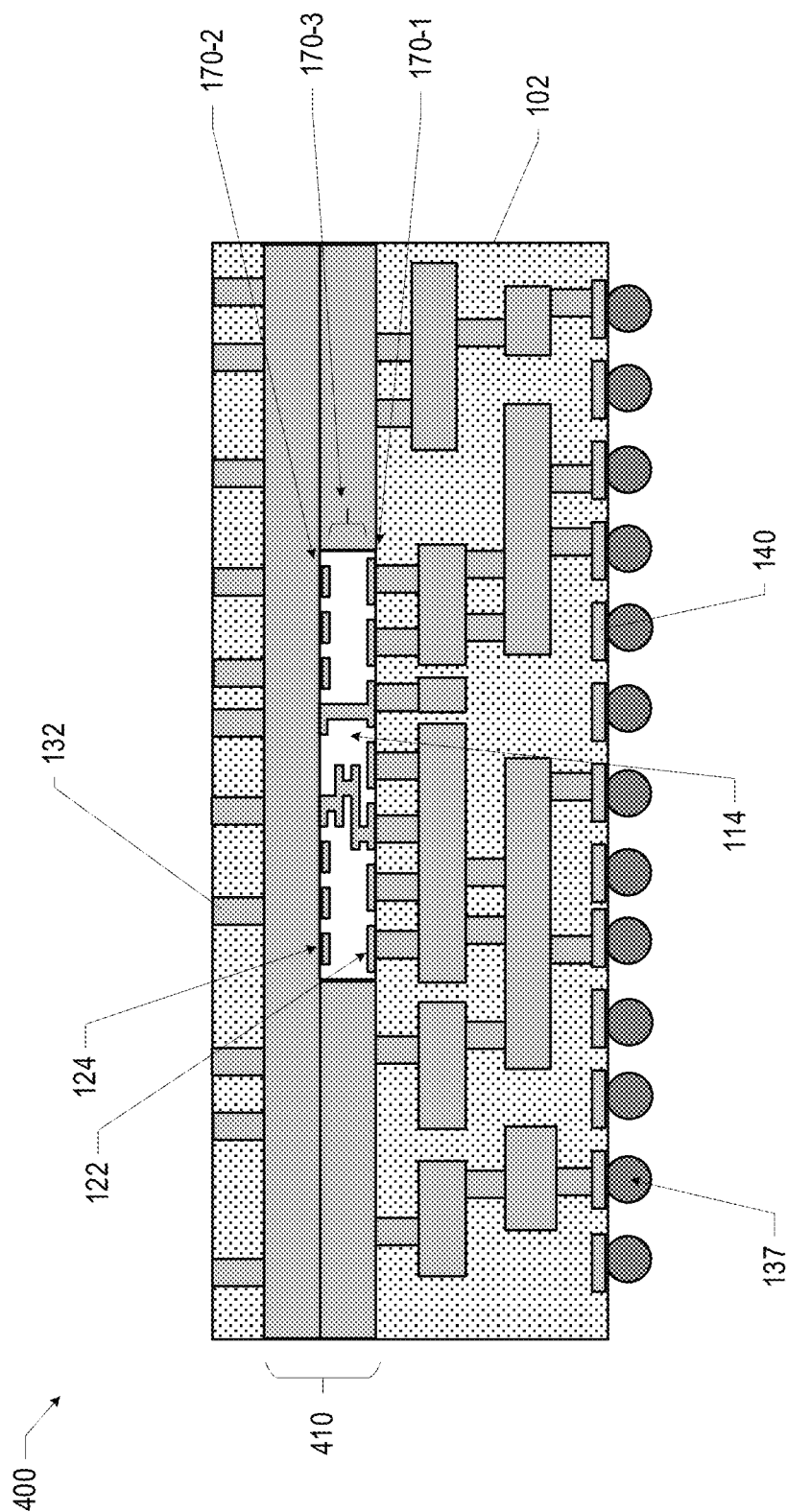
FIG. 4 is a side, cross-sectional view of an example microelectronic assembly having an embedded double-sided die within a metal plane, in accordance with various embodiments.

FIG. 4 is a side, cross-sectional view of an example microelectronic assembly 400 having a die embedded within a conductive plane of a package substrate, in accordance with various embodiments. The microelectronic assembly 400 may include a package substrate 102 having a die 114 embedded in a conductive plane 410 such that the conductive plane surrounds the die 114 on all sides 170-3 and on a top surface 170-2 to form a continuous conductive layer around the embedded die 114. In particular, the conductive plane 410 may minimize the impact of the cavity on the electrical performance of the conductive plane by reducing the size of the cavity formed for the embedded die (i.e., the dimensions of the cavity are approximately equal to the dimensions of the die). The conductive plane 410 may be any suitable material, including copper or copper alloys. The conductive plane may be formed using any suitable any suitable technique, including, for example, lithographical package process as described below with respect to FIG. 6. In some embodiments, the conductive plane 410 may cover a substantial portion of the package substrate XY surface area, where XY is the surface area of the package substrate portion defined by length times width. The conductive plane 410 may be perforated by traces and vias for connecting to conductive pathways in other layers. In some embodiments, the conductive plane may be used for power delivery or for radio frequency isolation. The conductive plane 410 may have any suitable dimensions. For example, the conductive plane 410 may have a thickness approximately twice a thickness of a die 114. In some embodiments, a thickness of the conductive plane may range from 10 um to 100 um.

The conductive contacts may be electrically coupled using any suitable thin stand-off height techniques, for example, an anisotropic conductive material, such as, an ACF or a conductive adhesive, or small stand-off height solder with or without NCF, among others.

Any suitable techniques may be used to manufacture the microelectronic assemblies disclosed herein. For example, FIGS. 5A-5H are side, cross-sectional views of various stages in an example process for manufacturing the microelectronic assembly 100A of FIG. 1A, in accordance with various embodiments. Although the operations discussed below with FIGS. 5A-5H (and others of the accompanying drawings representing manufacturing processes) are illustrated in a particular order, these operations may be performed in any suitable order. Additionally, although particular assemblies are illustrated in FIGS. 5A-5H (and others of the accompanying drawings representing manufacturing processes), the operations discussed below with reference to FIGS. 5A-5H may be used to form any suitable assemblies.

Figure 5A:
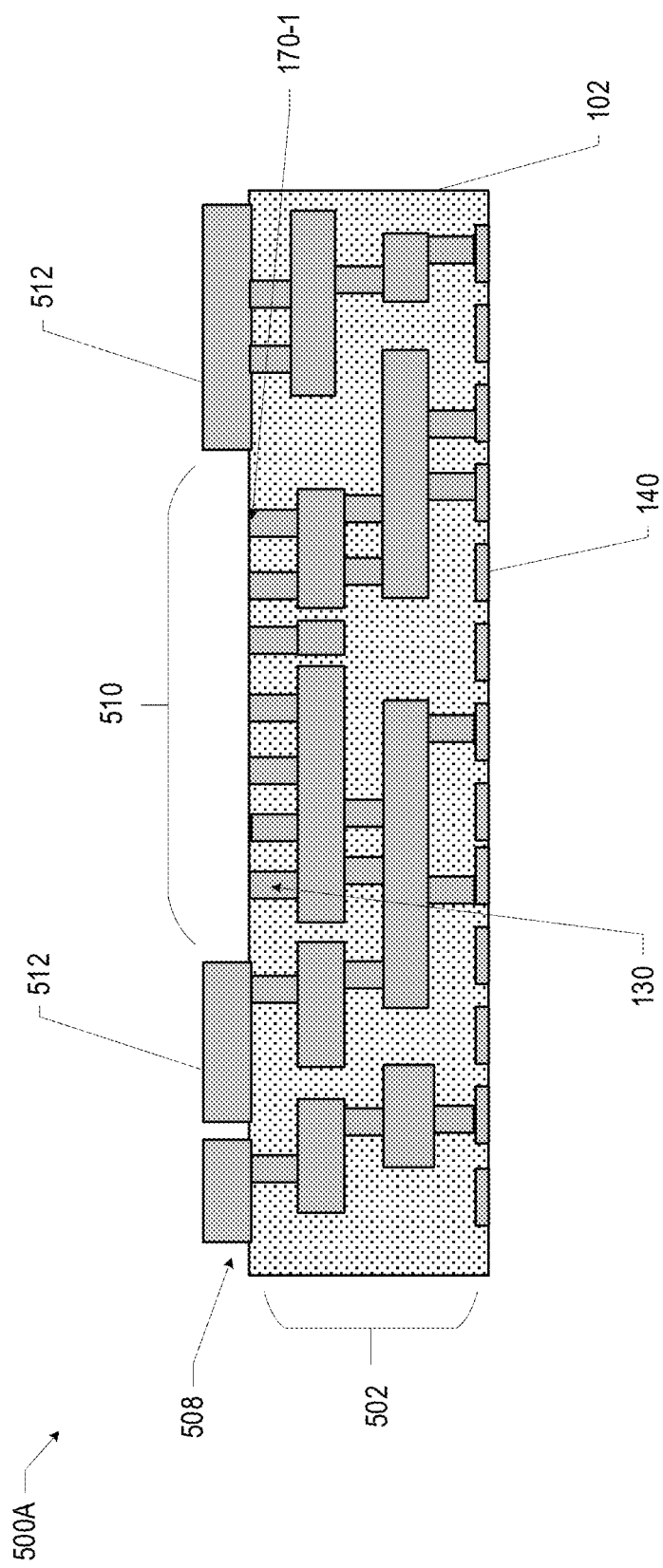
FIGS. 5A-5H are side, cross-sectional views of various stages in an example process for manufacturing the microelectronic assembly of FIG. 1A, in accordance with various embodiments.

FIG. 5A illustrates an assembly 500A including a package substrate portion 502. In some embodiments, the package substrate portion 502 may be formed using a lithographically defined via packaging process. In some embodiments, the package substrate portion 502 may be manufactured using standard PCB manufacturing processes, and thus the package substrate portion 502 may take the form of a PCB, as discussed above. In some embodiments, the package substrate portion 502 may be a set of redistribution layers formed on a panel carrier (not shown) by laminating or spinning on a dielectric material, and creating conductive vias and lines by laser drilling and plating. In some embodiments, the package substrate portion 502 may be formed on a removable carrier (not shown) using any suitable technique, such as a redistribution layer technique. Any method known in the art for fabrication of the package substrate portion 502 may be used, and for the sake of brevity, such methods will not be discussed in further detail herein. The package substrate portion may be the "bottom" portion of the package substrate 102, as discussed further below, and may include conductive contacts 140 at the bottom surface of the package substrate 102 for attaching to a circuit board.

The package substrate portion 502 may be built up to a desired layer for embedding the die. The package substrate portion may have padless vias 530 and other conductive features (not shown) on the top surface 170-1. In some embodiments, a metallization or conductive layer 508 may be patterned on the top surface 170-1 of the package substrate portion 502 to form a cavity 510 having the padless vias 530 or other conductive contacts (not shown) along the bottom side of the cavity (i.e., at the top surface 170-1 of the package substrate portion 502). The conductive layer 508 may be formed by depositing, exposing, and developing a photoresist layer on the top surface 170-1 of the package substrate portion 502. The photoresist layer may be patterned to form the cavity 510. Conductive material, such as copper, may be deposited in the openings in the patterned photoresist layer to form conductive features 512, such as traces and via pads and other passive structures such as package inductors or capacitors. The conductive material may be depositing using any suitable process, such as electroplating, sputtering, or electroless plating. The photoresist may be removed to expose the conductive features 512 and the formed cavity 510.

Figure 5B:
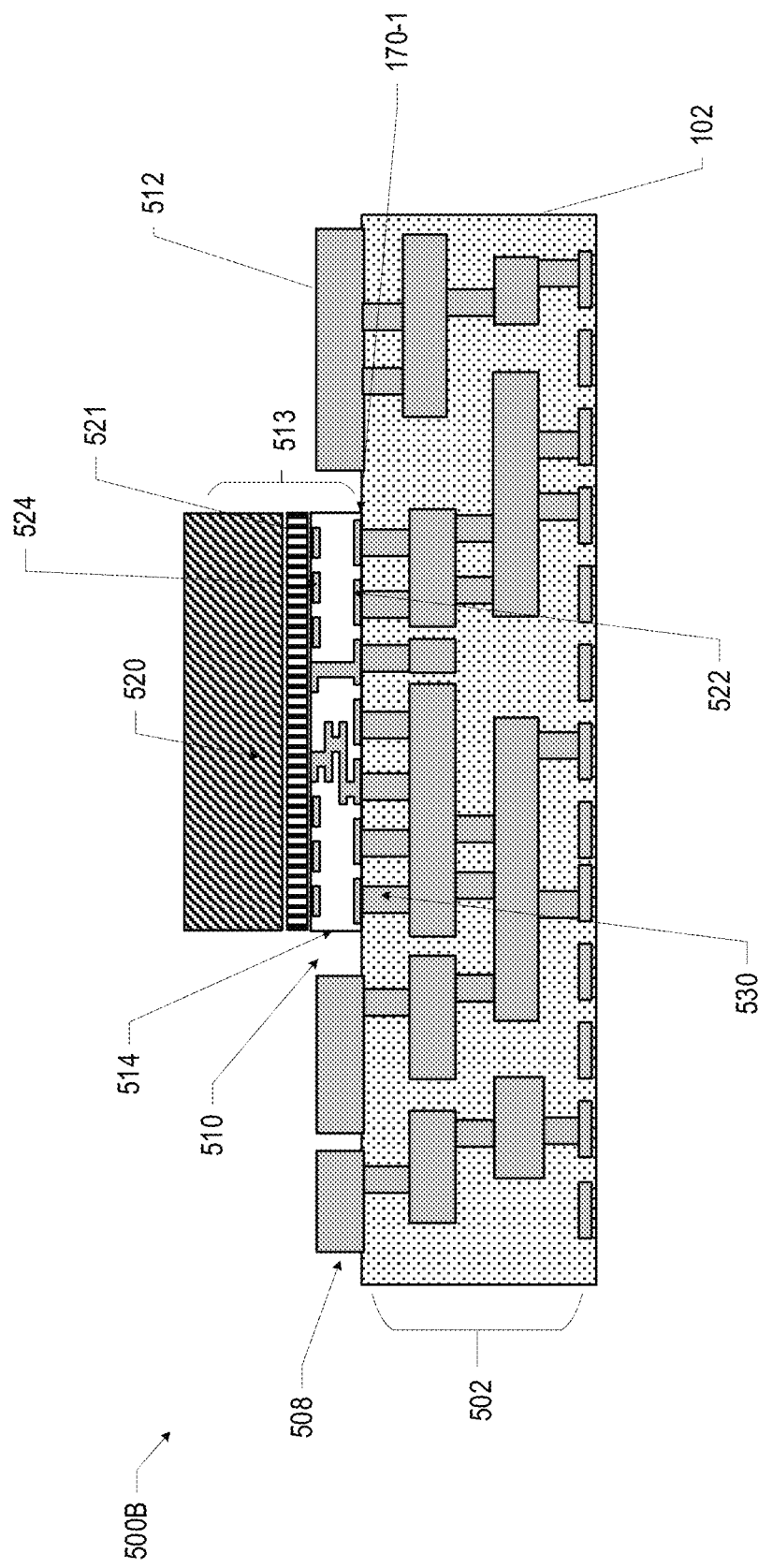

FIG. 5B illustrates an assembly 500B subsequent to positioning the die assembly 513 in the cavity 510 and coupling the die assembly 513 to the package substrate portion 502. The die assembly 513 may include a die 514 and a non-electrical material layer 520 on top of the die 514. The non-electrical material layer 520, which is an inactive portion of the die assembly 513, may include silicon, ceramic, or quartz, among other materials. In some embodiments, the non-electrical material layer 520 may have a thickness of 100 um to 750 um. In some embodiments, the non-electrical material layer 520 may have a thickness of 100 um to 250 um to minimize the amount material removed as described in more detail below in FIG. 5C. The non-electrical material layer 520 may be attached to the die 514 using any suitable technique, including, for example, a release layer 521. The release layer 521 (also referred to herein as a debonding layer) may include a temporary adhesive, or other material that releases when exposed to heat or light, for example. The die 514 may include any of the features discussed above with reference to the die 114. In some embodiments, for example, the die 514 may include a layer of transistors (not shown), such as silicon transistors, within an interlayer dielectric (ILD) layer, and the ILD may have multiple conductive layers that may connect conductive contacts 522 on the bottom of the die 514 to connective contacts 524 on the top of the die 514. In particular, the die assembly 513 may be arranged in the assembly 500B such that the conductive contacts 522 of the die 514 may be coupled to the padless vias 530 of the package substrate portion 502. In some embodiments, multiple cavities may be formed such that multiple dies may be embedded in a single layer as described above with reference to FIGS. 1B and 1C.

In the embodiment of FIGS. 5A-5H, the die assembly 513 may be disposed on a carrier (not shown) that provides improved mechanical stability, and then may be coupled to the package substrate portion 502. This approach may be particularly desirable for relatively small dies. The die assembly 513 may be "upside down" on the carrier, in the sense that the conductive contacts 522 on the bottom surface of the die 514 are facing away from the carrier, and the non-electrical material layer 520 is attached to the carrier. The die assembly 513 may be secured to the carrier using any suitable technique, such as a removable adhesive. In some embodiments, more than one die may be secured to the carrier and placed on the package substrate portion at the same time. The carrier may include any suitable material for providing mechanical stability during manufacturing operations.

Figure 5C:
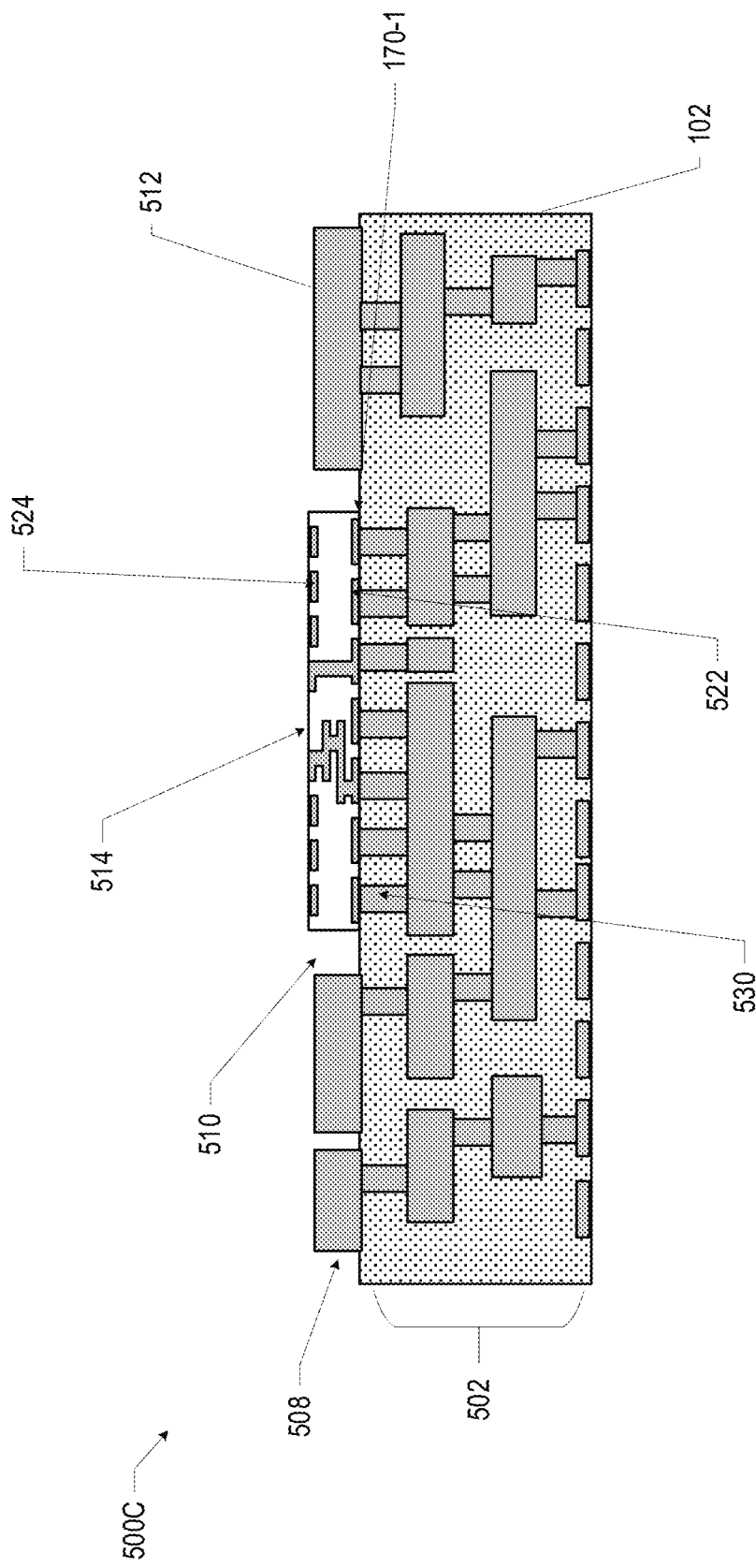

FIG. 5C illustrates an assembly 500C subsequent to removing the non-electrical material layer 520 and the debonding layer 521 from the die 514. The non-electrical material layer 520 may be removed using any suitable technique, including, for example, grinding, etching, such as RIE or chemical etching, or, if the debonding layer includes a photo-reactive or thermally-reactive material, applying light or heat.

In the embodiment of FIGS. 5A-5H, the die assembly 513 may be coupled to the package substrate portion 502 prior to the conductive layer 508 being formed, such that the conductive layer 508 may be formed to surround the die assembly 513. The conductive layer 508 may be formed around the coupled die as described above with respect to FIG. 5A (e.g., using a lithographically defined via process) and may be formed prior to removing the non-electrical material layer 520 or may be formed after removal of the non-electrical material layer 520. In some embodiments, more than one die assembly 513 may be coupled to the package substrate prior to the conductive layer 508 being formed.

Figure 5D:
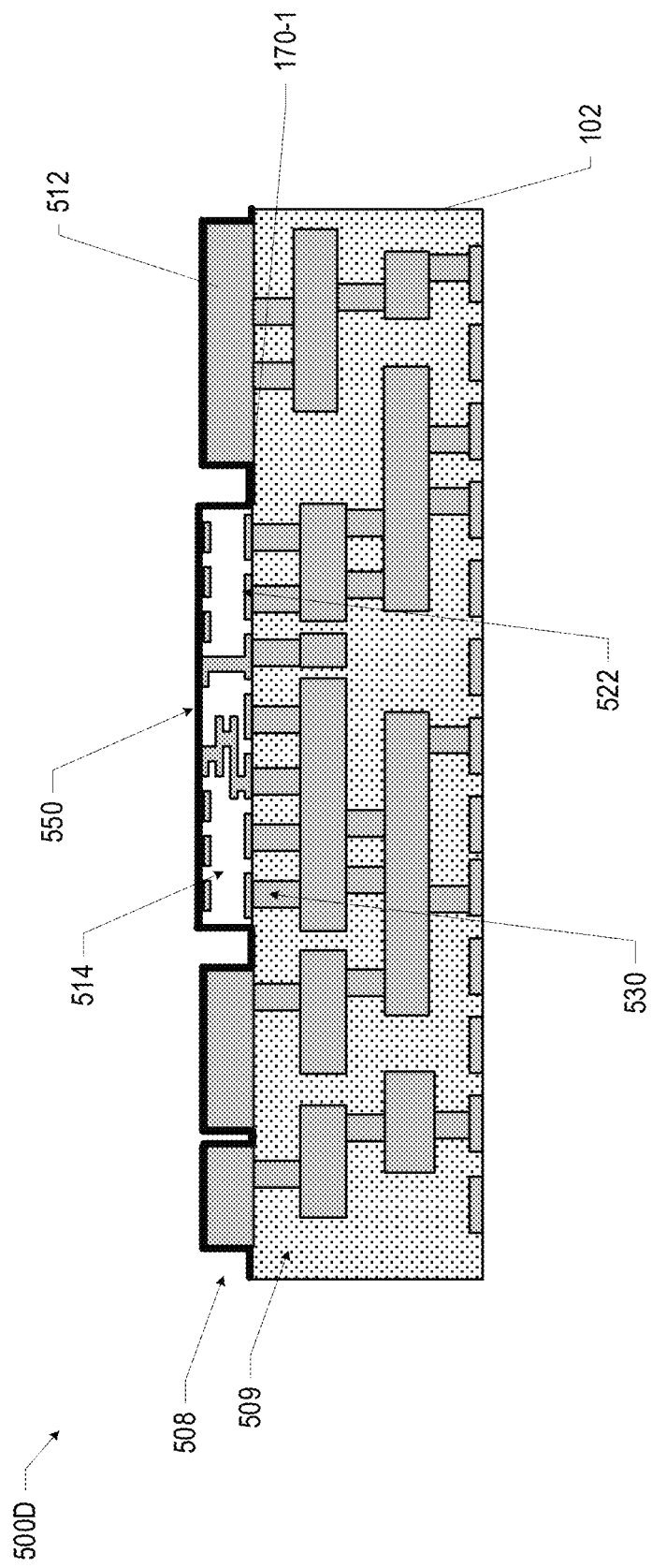

FIG. 5D illustrates an assembly 500D subsequent to depositing a seed layer 550 over a top surface of the assembly 500C. The seed layer 550 may be formed over the top surface to cover the dielectric layer 509, the conductive features 512, and the die 514. The seed layer 550 may be any suitable conductive material, including copper. In some embodiments, the seed layer 550 may be omitted.

Figure 5E:
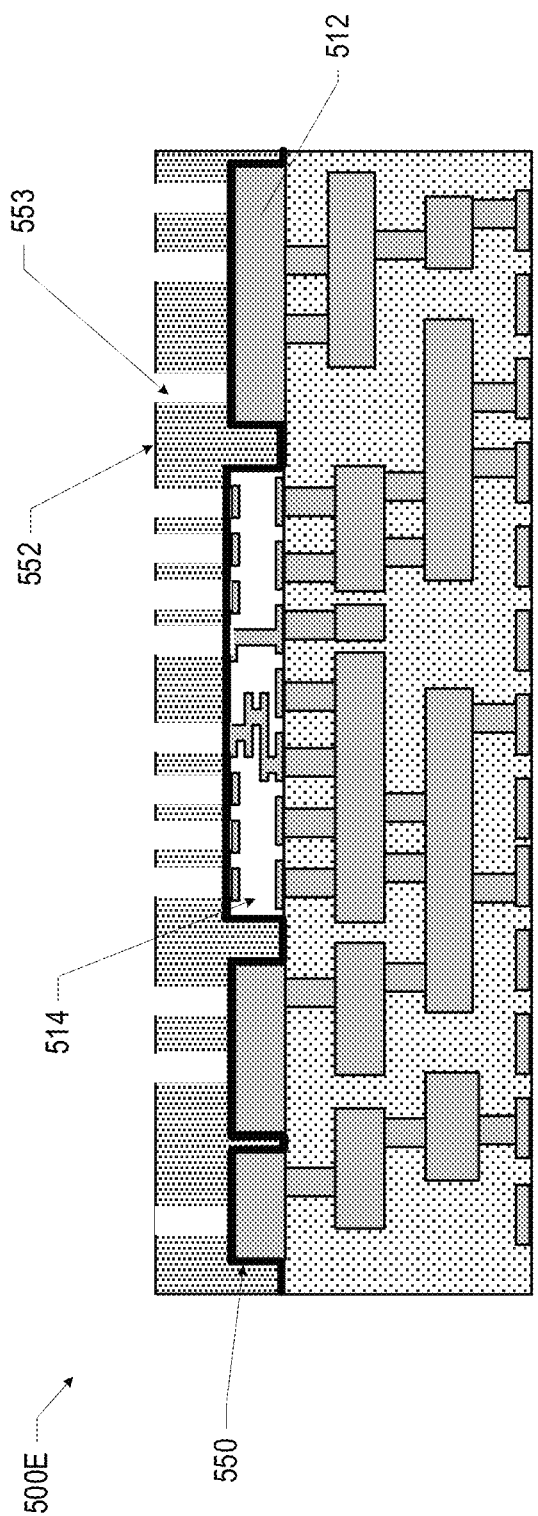

FIG. 5E illustrates an assembly 500E subsequent to depositing a photoresist material 552 over the seed layer 550 and patterning the photoresist material to provide openings 553 for the formation of conductive features. The photoresist material 552 may be patterned using any suitable technique, including a lithographic process (e.g., exposing the photoresist material to a radiation source through a mask and developing with a developer). The openings 553 may have any suitable size and shape for forming a conductive structure having desired characteristics. For example, opening 553 may shaped to form a conductive via having a round cross-section.

Figure 5F:
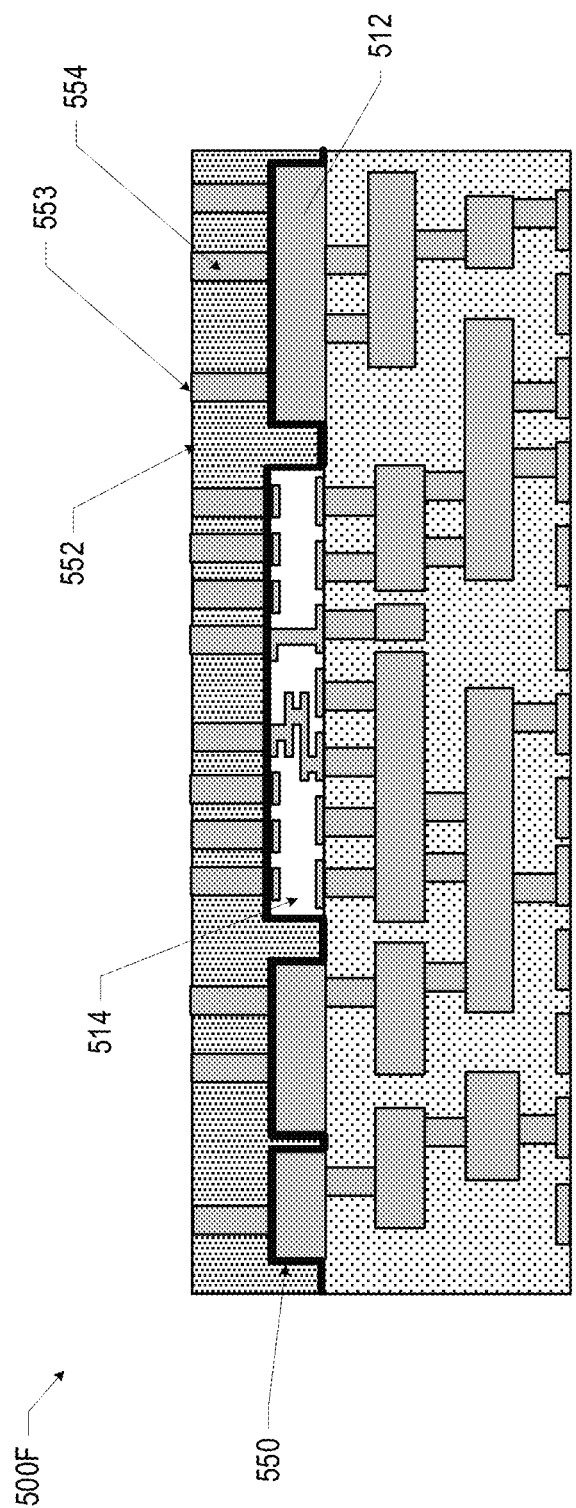

FIG. 5F illustrates an assembly 500F subsequent to depositing a conductive material in the openings 553 of assembly 500E to form conductive structures 554. The conductive material may be deposited using any suitable technique, including, for example, electroplating, sputtering, or electroless plating.

Figure 5G:
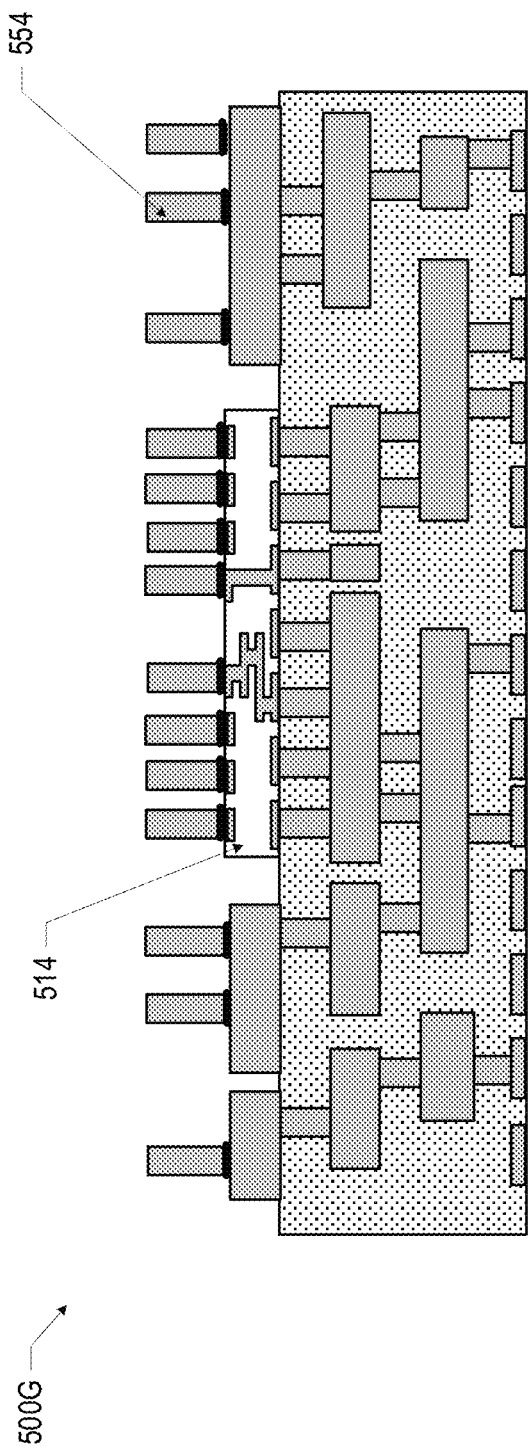

FIG. 5G illustrates an assembly 500G subsequent to stripping the photoresist material 552 to expose the conductive structures 554 and removing the remaining portions of the seed layer 550. The seed layer may be removed using any suitable process, including chemical etching, among others. Although FIG. 5G shows the conductive structures 554 as conductive vias, the conductive structures 554 may take any form, including conductive traces, or a heat spreader, among others.

Figure 5H:
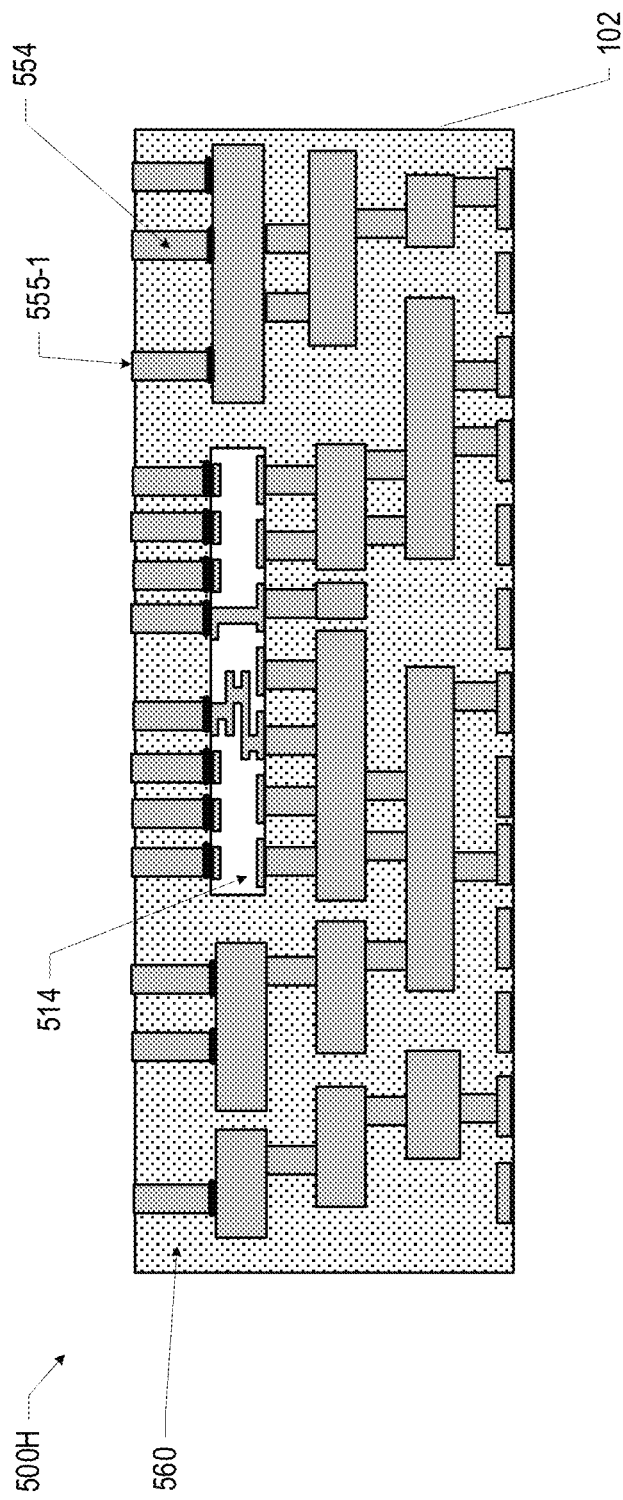

FIG. 5H illustrates an assembly 500H subsequent to forming a dielectric layer 560 over a top surface of assembly 500G and exposing the top surface 555-1 of the conductive structures 554. The dielectric layer 560 may be formed using any suitable process, including lamination, or slit coating and curing. The dielectric layer 560 may be formed to completely cover the conductive structures 554, such that the thickness of the deposited dielectric layer 560 is greater than the thickness of the conductive structures 554. The dielectric layer 560 may be removed to expose the top surface 555-1 of the conductive structures 554 using any suitable technique, including grinding, or etching, such as a wet etch, a dry etch (e.g., a plasma etch), a wet blast, or a laser ablation (e.g., using excimer laser). In some embodiments, the thickness of the dielectric layer 560 may be minimized to reduce the etching time required to expose the top surface 555-1 of the conductive structures 554.

In some embodiments, for example, for a die having a thickness that is greater than a thickness of the conductive layer, after forming a cavity in the conductive layer, a dielectric layer may be deposited on the conductive layer and the dielectric material may be removed from the cavity by laser ablation or other process, before placing the die.

Additional layers may be built up and additional dies may be embedded in the package substrate 102 in other layers by repeating the process as described with respect to FIGS. 5A-5H. The finished substrate may be a single package substrate or may be a repeating unit that may undergo a singulation process in which each unit is separated for one another to create a single package substrate. Further operations may be performed as suitable (e.g., attaching additional dies to the package substrate 102, attaching solder balls for coupling to a circuit board, etc.).

Figure 6A:
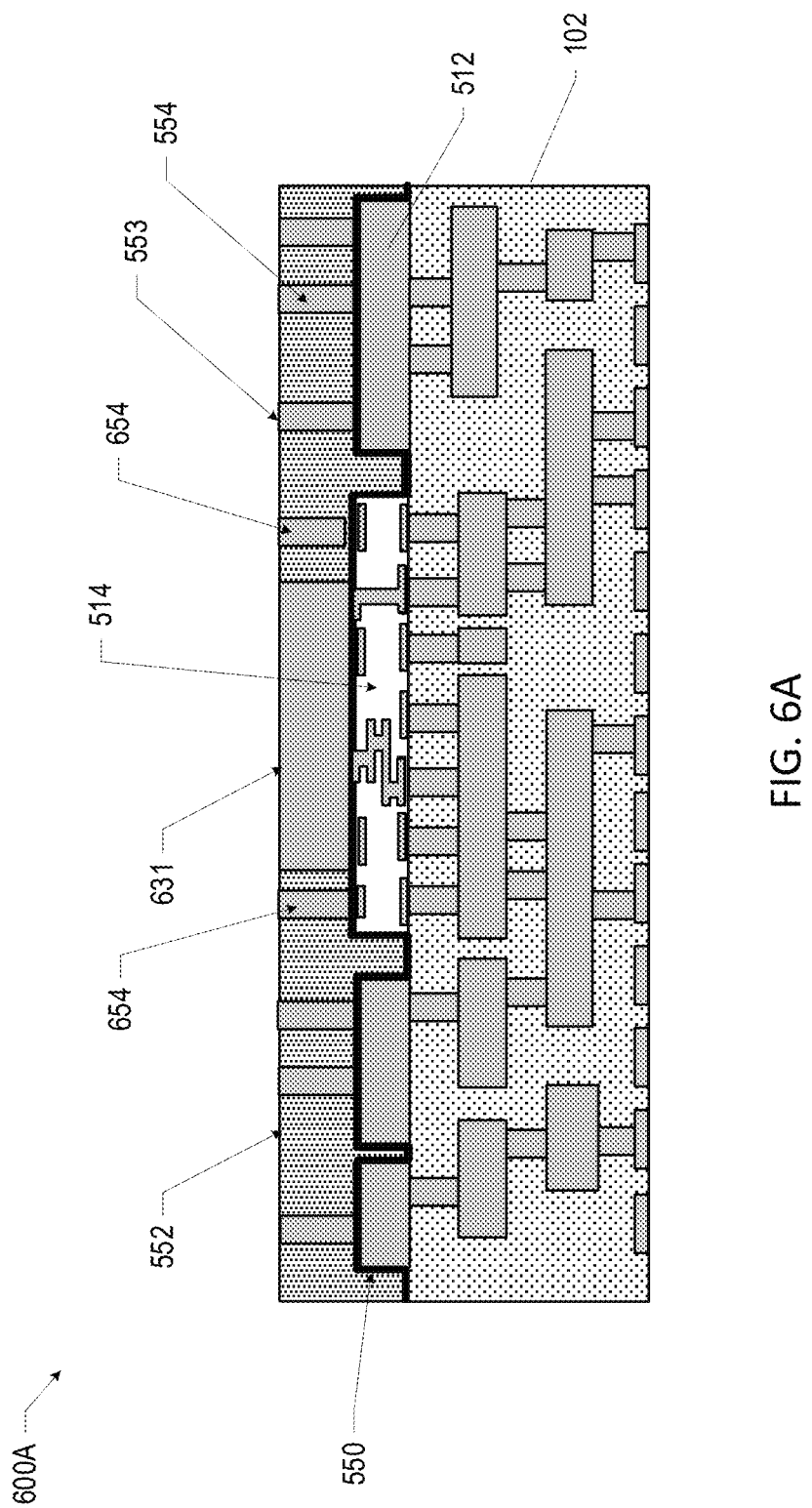
FIGS. 6A-6B are side, cross-sectional views of various stages in an example process for manufacturing the microelectronic assembly of FIG. 2A, in accordance with various embodiments.

FIG. 6A is a side, cross-sectional view of an example process for manufacturing a microelectronic assembly having a heat spreader, such as 200A of FIG. 2A, in accordance with various embodiments. FIG. 6A illustrates an assembly 600A subsequent to depositing a photoresist material 552 over a seed layer 550, patterning the photoresist material, and depositing conductive material in the openings 553 for the formation of conductive features 554, as described above with reference to FIGS. 5A-5F. The photoresist material 552 may be patterned to form a heat spreader 631 and the conductive vias 654 on the top surface of the die 514 as well as other conductive structures. The heat spreader may have any suitable size and shape, and multiple heat spreaders may be formed on a surface of the die 514, as described above with reference to FIG. 2. Although FIG. 2 and FIG. 6 show a heat spreader on the top surface of the die 514, a heat spreader may be formed on the top surface 170-1 of the package substrate portion 502 such that the heat spreader is on the bottom surface of the die 514. Further operations may be performed on the assembly 600A, for example, as described in FIGS. 5G and 5H, including removing the photoresist material, etching the seed layer, if necessary, and depositing and etching a dielectric layer to expose the top surface of the conductive structures 631, 654.

Figure 6B:
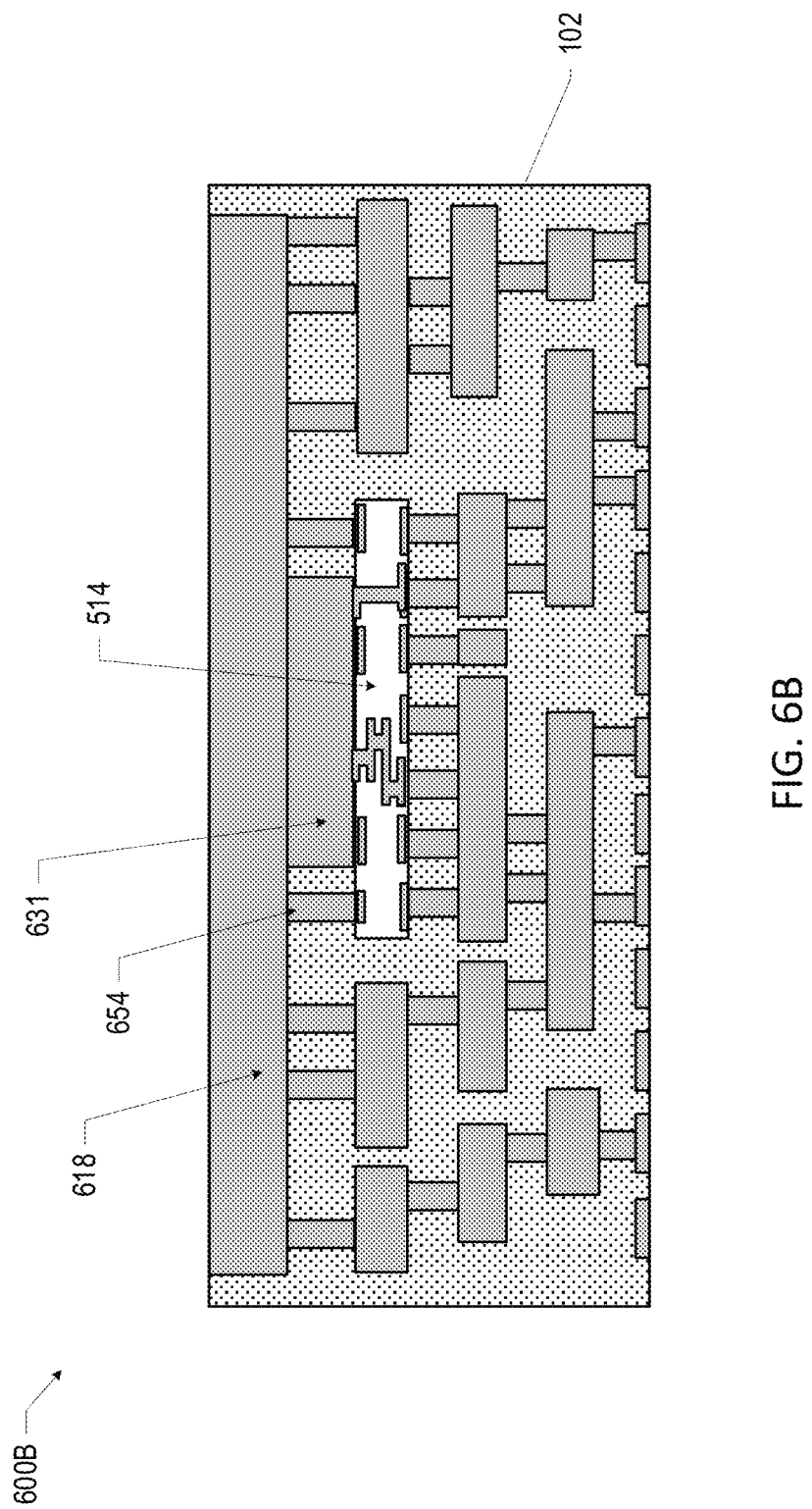

FIG. 6B illustrates an assembly 600B subsequent to depositing a conductive plane 618 on the top surface of the heat spreader 631. As described above with reference to FIG. 4, the heat spreader 631 and the conductive plane 618 may be in thermal contact and may function collectively to dissipate heat away from die 514. The conductive plane 618 may be formed as described above with respect to conductive layer 508 in FIG. 5. Additional layers may be built up and additional dies may be embedded in other layers of the package substrate 102 by, for example, repeating the process as described with respect to FIGS. 5A-5H. Further operations may be performed as suitable (e.g., attaching additional dies to the package substrate 102, attaching solder balls for coupling to a circuit board, etc.).

Figure 7A:
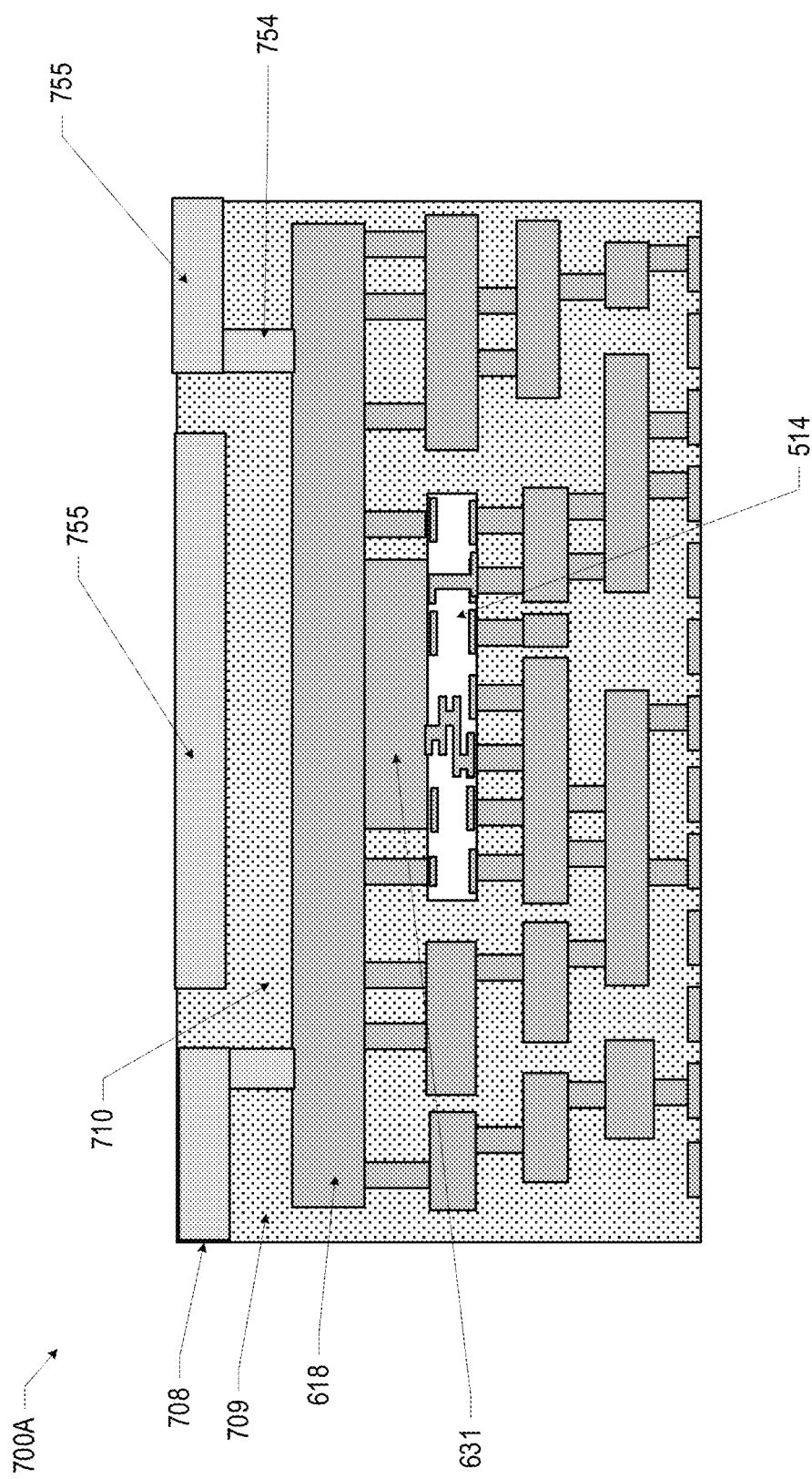
FIGS. 7A-7B are side, cross-sectional views of various stages in an example process for manufacturing the microelectronic assembly of FIG. 3A, in accordance with various embodiments.
Figure 7B:
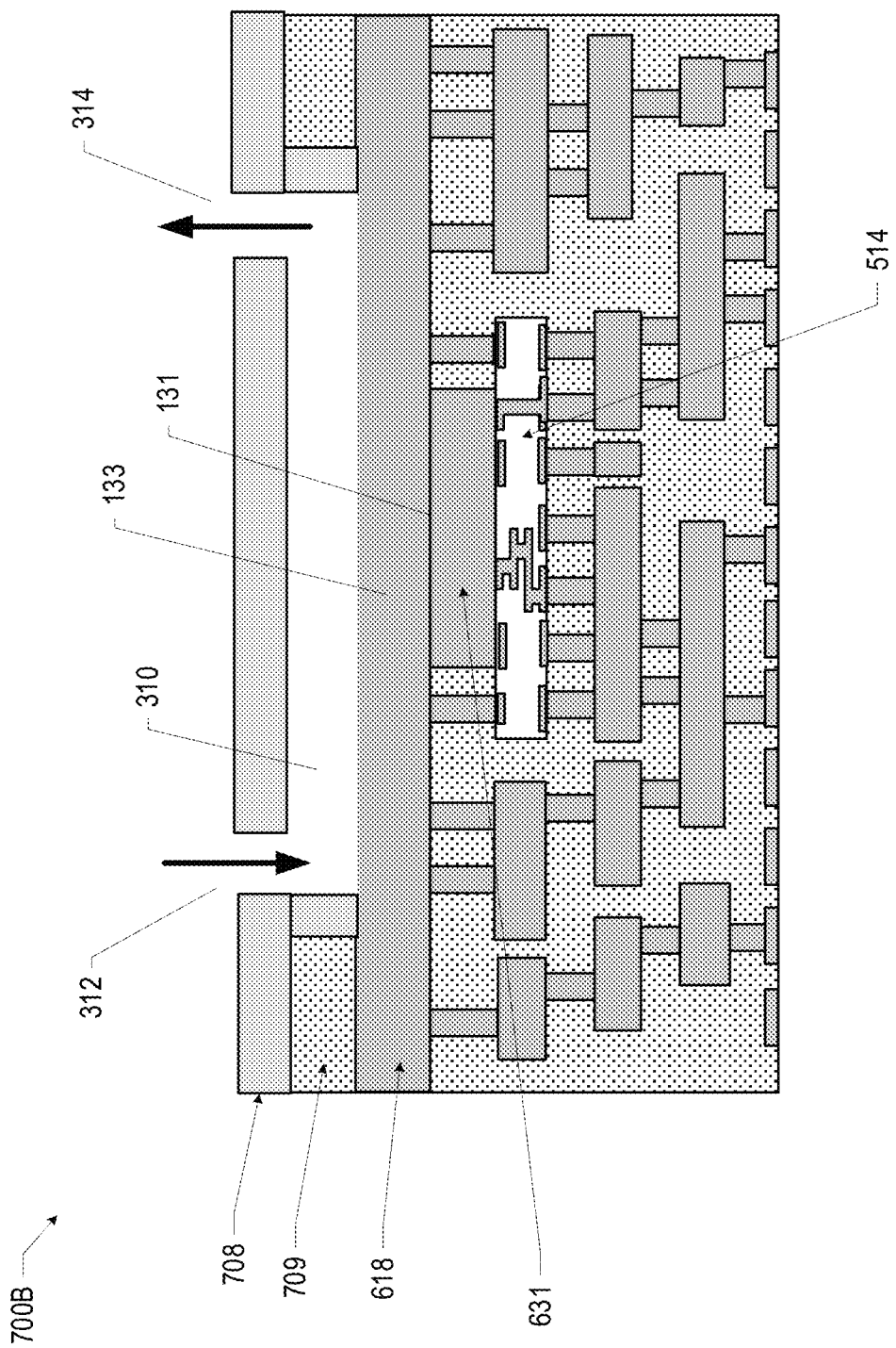

FIGS. 7A-7B are side, cross-sectional views of an example process for manufacturing a microelectronic assembly having a heat spreader and a channel, such as microelectronic assembly 300 of FIG. 3A, in accordance with various embodiments. FIG. 7A illustrates an assembly 700A subsequent to forming conductive vias 754 within a dielectric layer 709 and conductive structures 755 within a conductive layer 708 on assembly 600B. The conductive vias 754 and conductive structures 755 may be formed by any suitable process, including the process described above with reference to FIGS. 5A-5H. The conductive vias 754 and the conductive structures 755 may form a channel 710.

FIG. 7B illustrates an assembly 700B subsequent to removing the dielectric material from the channel 710. The dielectric material may be removed from the channel using any suitable process, including RIE or chemical etching. The hollow channel 710 may be filled with water, coolant, or other fluid to more efficiently dissipate heat from the die 514. As described above with reference to FIG. 3B, the channel 710 may be in the layer directly above the heat spreader 631 by omitting the conductive plane 618 and using the same process described with reference to FIGS. 5A-5H and FIGS. 7A-7B.

FIGS. 8A-8E are side, cross-sectional views of various stages in an example process for manufacturing the microelectronic assembly 400 of FIG. 4, in accordance with various embodiments.

Figure 8A:
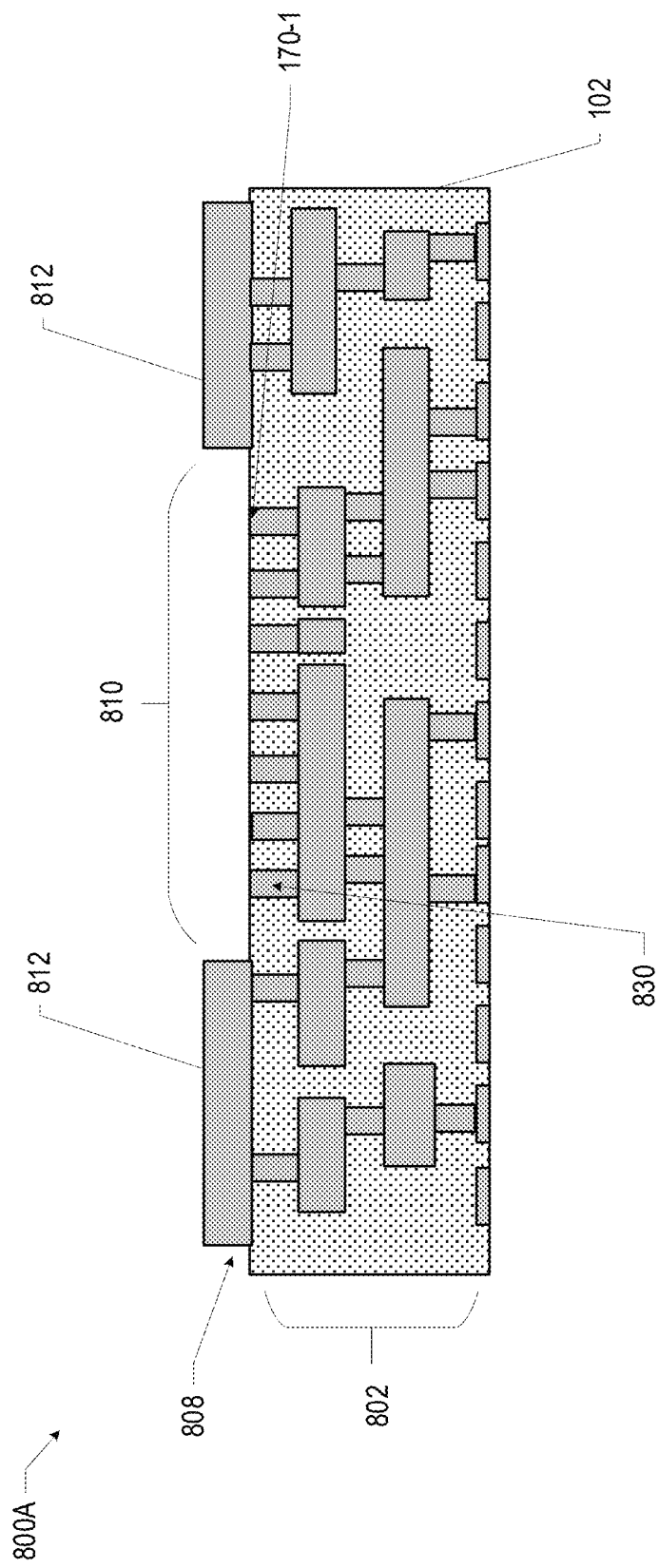
FIGS. 8A-8E are side, cross-sectional views of various stages in an example process for manufacturing the microelectronic assembly of FIG. 4, in accordance with various embodiments.

FIG. 8A illustrates an assembly 800A including a package substrate portion 802. Any method known in the art for fabrication of the package substrate portion 802 may be used as disclosed above with reference to FIG. 5, and for the sake of brevity, such methods will not be discussed in further detail herein. The package substrate portion 802 may be built up until a desired layer for embedding the die. The package substrate portion 802 may have padless vias 830 and other conductive features (not shown) on the top surface 170-1. In some embodiments, a conductive layer 808 having a cavity 810 may be patterned on the top surface 170-1 of the package substrate portion 802. The conductive layer 808 may be formed by depositing, exposing, and developing a photoresist layer on the top surface 170-1 of the package substrate portion 802. The photoresist layer may be patterned to form the cavity 810. Conductive material, such as copper, may be deposited in the openings in the patterned photoresist layer to form conductive features 812. In some embodiments, the conductive features 812 may form a conductive plane with an opening to form the cavity 810. The conductive material may be depositing using any suitable process, such as electroplating, sputtering, or electroless plating. The photoresist may be removed to expose the conductive features 812 and the formed cavity 810.

Figure 8B:
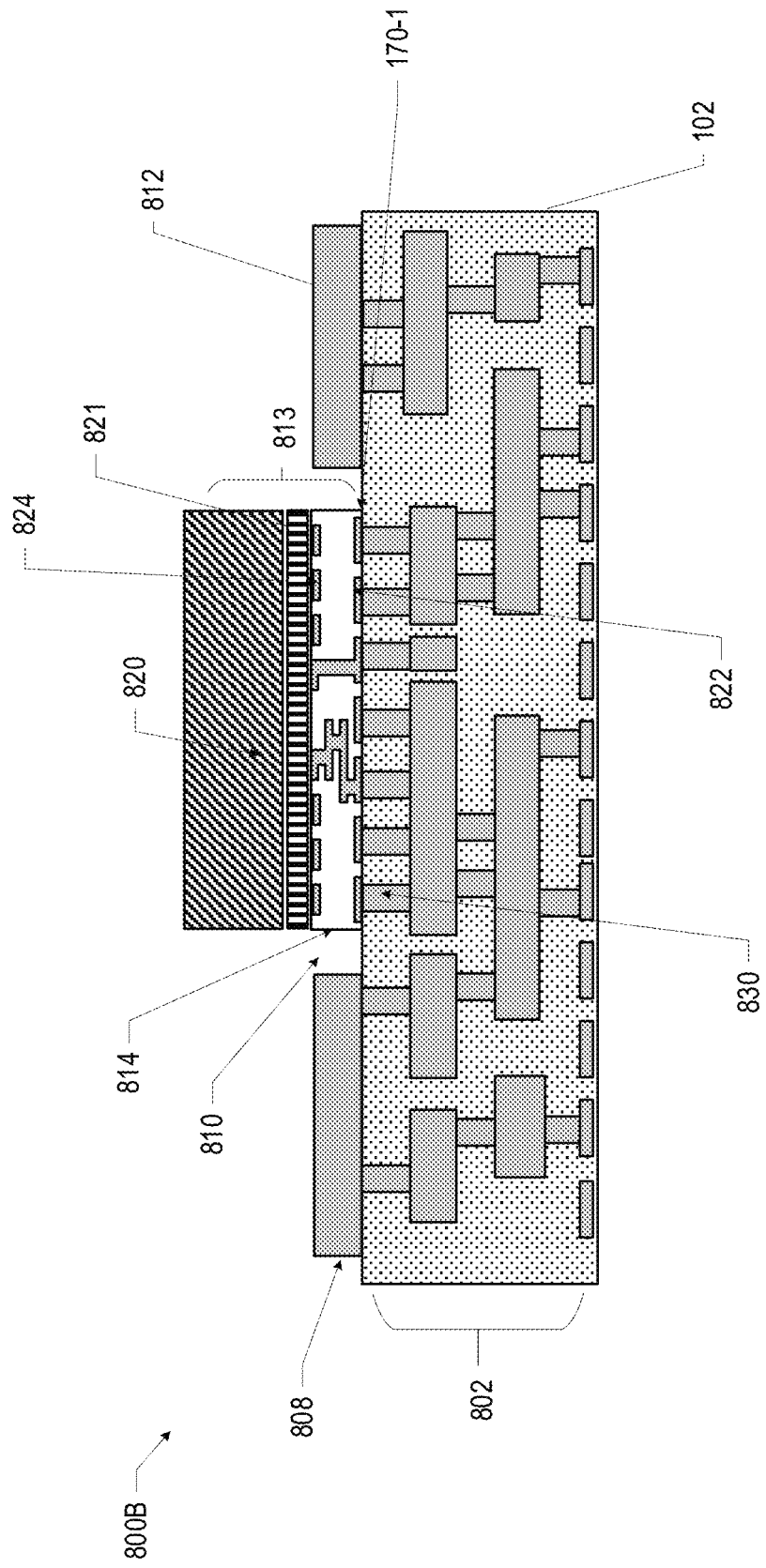

FIG. 8B illustrates an assembly 800B subsequent to positioning the die assembly 813 in the cavity 810 and coupling the die assembly 813 to the package substrate portion 802 via the conductive contacts 822. The die assembly 813 may include a die 814 having surface conductive contacts 822, 824 and a non-electrical material layer 820 on top of the die 814. In some embodiments, the non-electrical material layer 820 may be attached to the die 814 by a release layer 821. The die assembly 813 may have characteristics as described above with reference to the die assembly 513 of FIG. 5. The die assembly 813 may be positioned and coupled to the package substrate portion 802 as described above with reference to the die assembly 513 of FIG. 5. In some embodiments, multiple cavities 810 may be formed such that multiple dies may be embedded in a single layer.

Figure 8C:
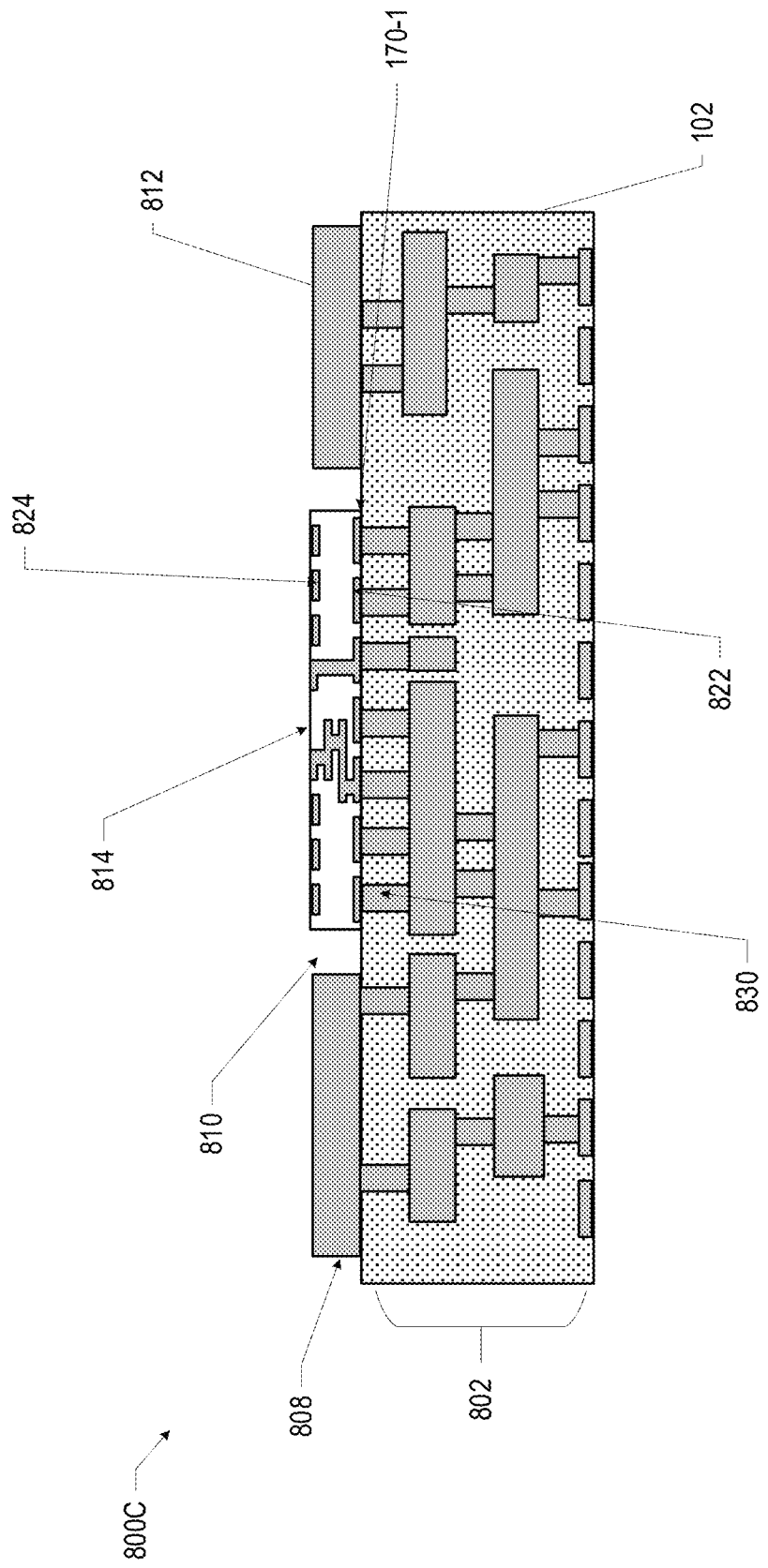

FIG. 8C illustrates an assembly 800C subsequent to removing the non-electrical material layer 820 and the release layer 821 from the die 814. The non-electrical material layer 820 may be removed using any suitable technique, as described above with reference to FIG. 5. In some embodiments, the die assembly 813 may be coupled to the package substrate portion 802 prior to the conductive layer 808 being formed, such that the conductive layer 808 may be formed to surround the die assembly 813. The conductive layer 808 may be formed around the die as described above with respect to FIG. 5A and may be formed prior to removing the non-electrical material layer 820 or may be formed after removal of the non-electrical material layer 820. In some embodiments, more than one die assembly 813 may be coupled to the package substrate prior to the conductive layer 808 being formed.

Figure 8D:
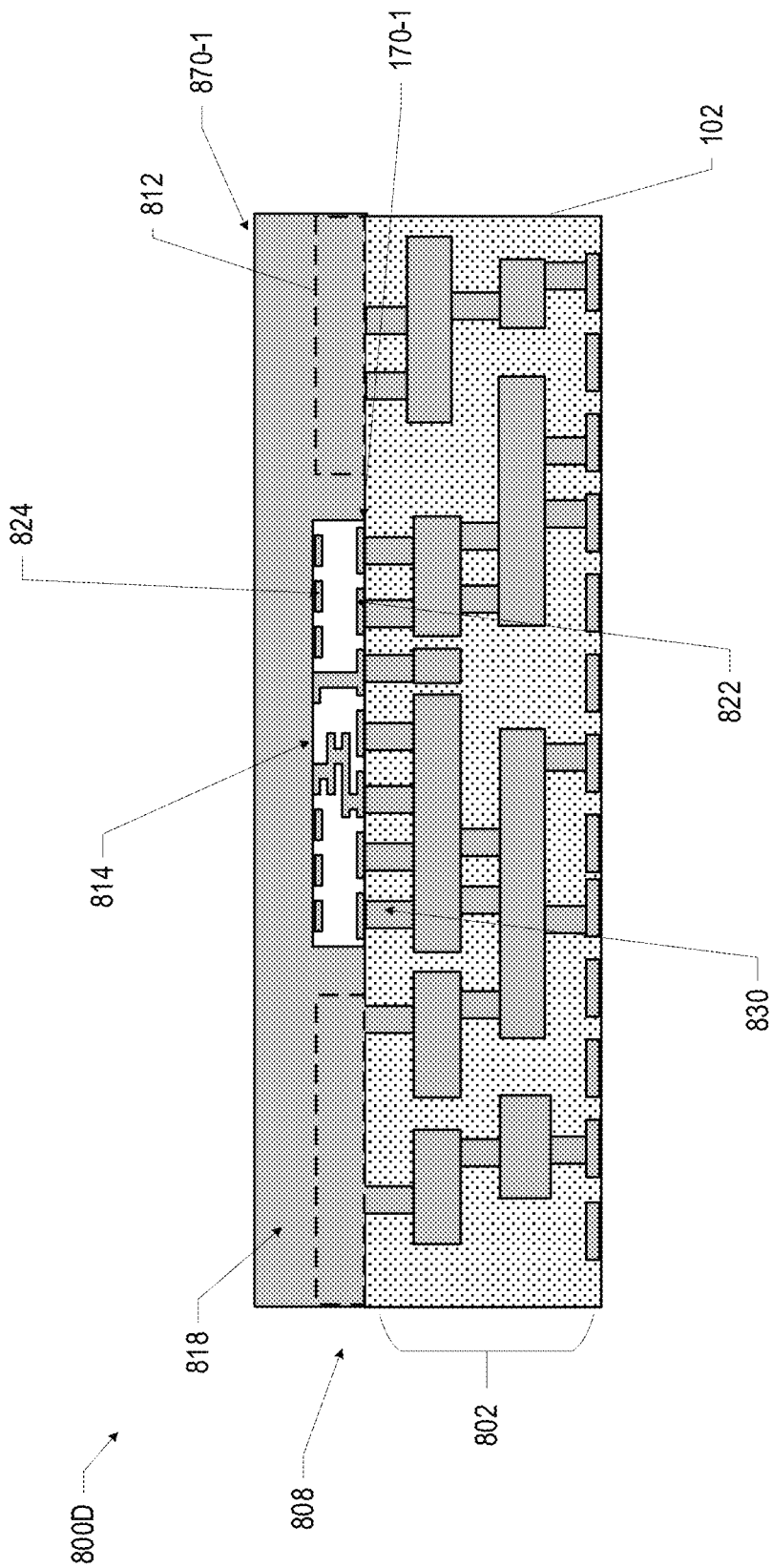

FIG. 8D illustrates an assembly 800D subsequent to depositing a conductive layer 818 over a top surface of the assembly 800C. The conductive layer 818 may be formed as a plane to cover the conductive features 812 and the die 814. The conductive layer 818 may be any suitable conductive material, including copper. In some embodiments, the conductive layer 818 may have a thickness measured from the top surface 170-1 of the package substrate portion 802 to the top surface of the conductive layer 870-1 that ranges from 15 um to 80 um. In some embodiments, the conductive layer 818 may have a thickness measured from the top surface 170-1 of the package substrate portion 802 to the top surface of the conductive layer 870-1 that ranges from 25 um to 50 um. In some embodiments, the conductive layer 818 may have a thickness measured from the top surface 170-1 of the package substrate portion 802 to the top surface of the conductive layer 870-1 that ranges from 20 um to 40 um.

Figure 8E:
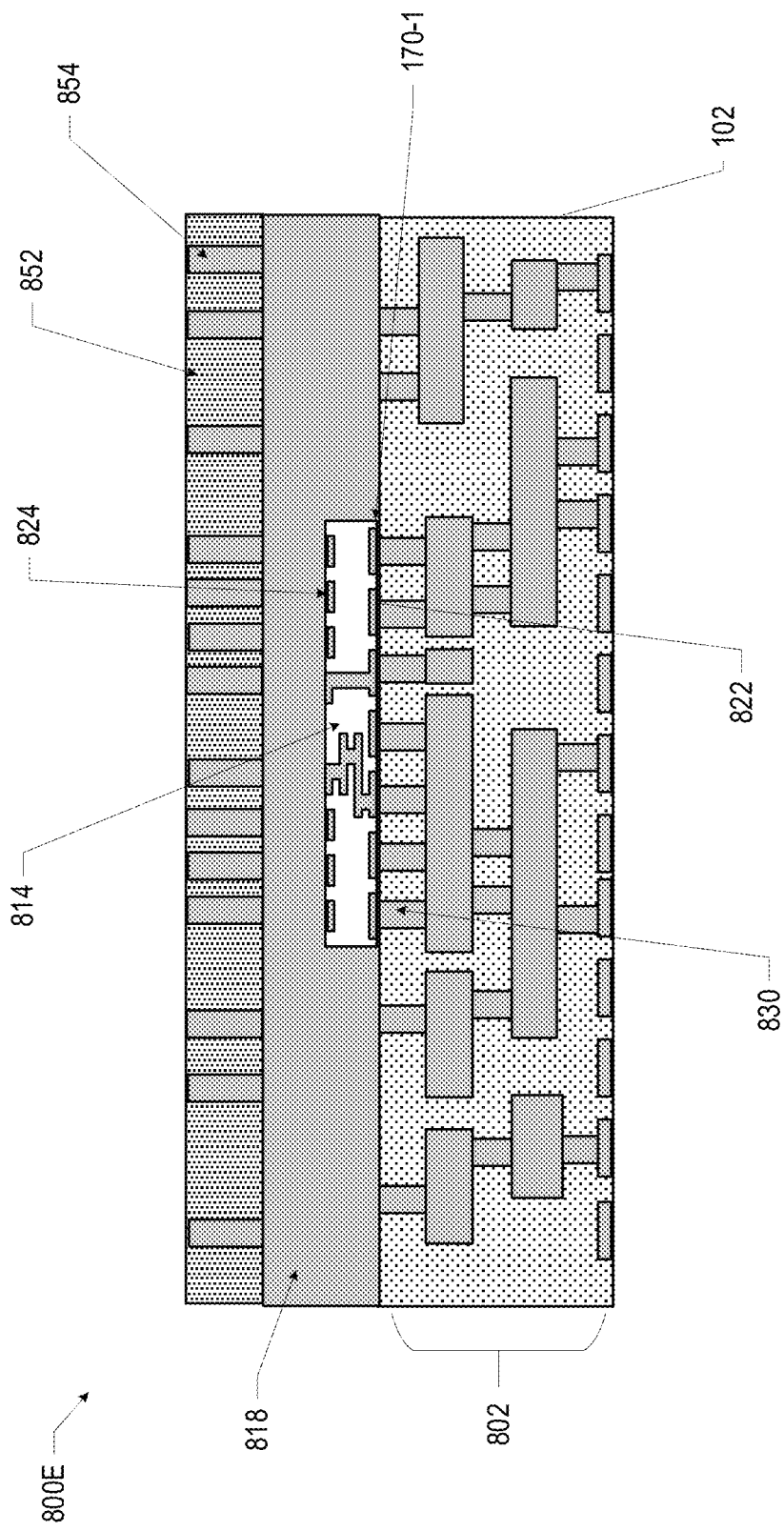

FIG. 8E illustrates an assembly 800E subsequent to forming conductive features 854 and depositing a dielectric layer 852 on the surface of assembly 800D. The conductive features and dielectric layer may be formed using any suitable process, including, as described above with reference to FIG. 5.

Figure 9:
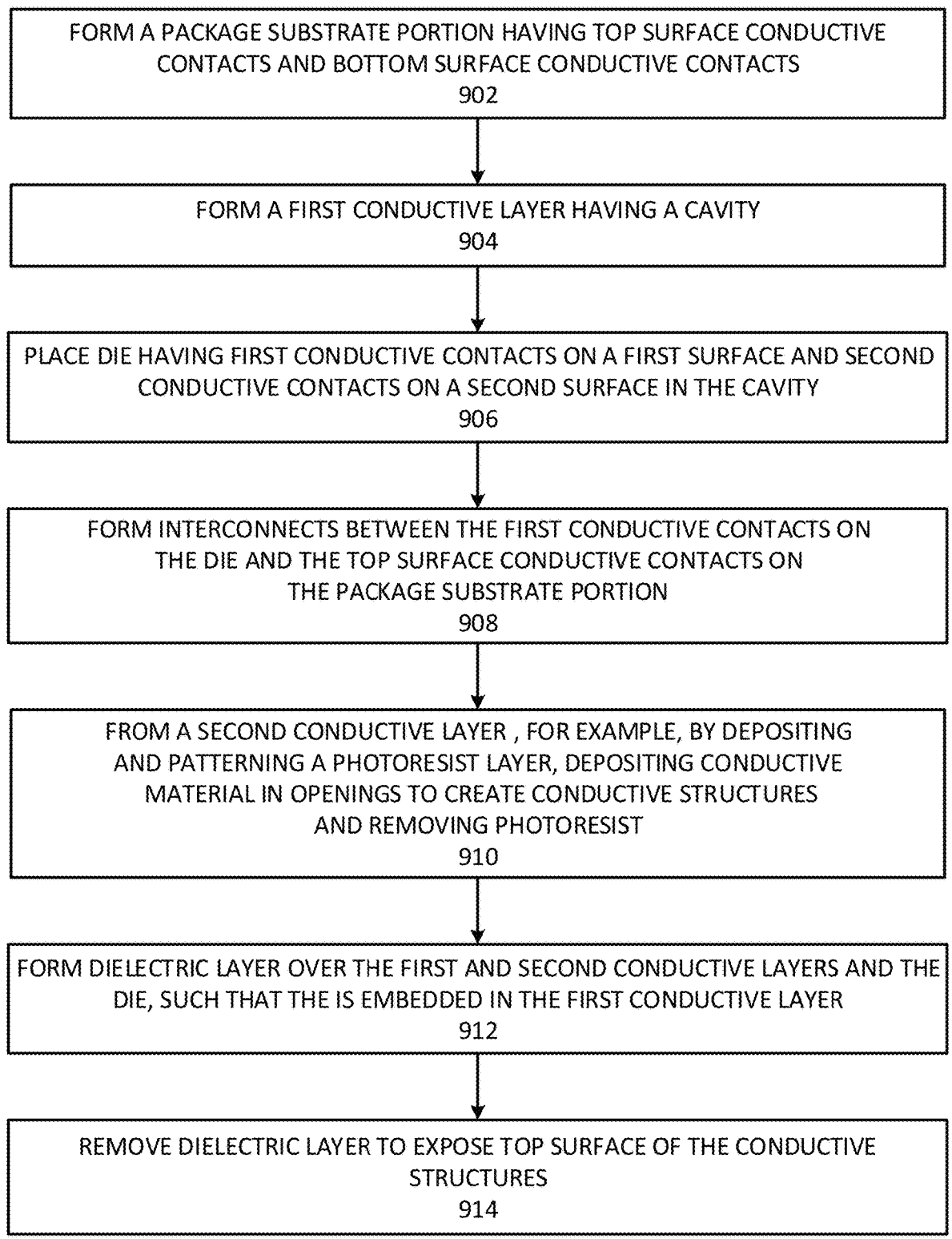
FIG. 9 is a process flow diagram of an example method of forming a microelectronic assembly having an embedded double-sided die, in accordance with various embodiments.

FIG. 9 is a process flow diagram of an example method of forming a microelectronic assembly having an embedded double-sided die, in accordance with various embodiments. At 902, a portion of a package substrate may be formed. The package substrate portion may have a top surface with top surface conductive contacts and an opposing bottom surface having bottom surface conductive contacts. The top surface of the package substrate portion may be the layer for embedding a die and coupling the die to the package substrate portion via the top surface conductive contacts. The package substrate portion may be coupled to a circuit board via the bottom surface conductive contacts. At 904, a first conductive layer having a cavity may be patterned and deposited on the top surface of the package substrate portion. The cavity may have the top surface conductive contacts of the package substrate portion on the bottom of the cavity. In some embodiments, the first conductive layer may have a plurality of cavities, such that a plurality of dies may be embedded in the same layer. At 906, a die may be placed in the cavity. The die may have a first surface with first conductive contacts and an opposing second surface with second conductive contacts. The die may further have a non-electrical material covering the second conductive contacts. The die may be placed in the cavity with the first conductive contacts facing the top surface conductive contacts on the package substrate portion. At 908, after placing the die in the cavity, first interconnects may be formed between the first conductive contacts on the die and the top surface conductive contacts on the package substrate portion. The first interconnects may include any suitable interconnect disclosed herein, including an anisotropic conductive material, a DAF, metal-to metal interconnects, and/or solder. If other dies are being embedded in the first conductive layer, the additional dies may be placed in their respective cavity and interconnects may be formed between the first interconnects on die and the top conductive contacts on the package substrate portion. Further, after placing the die in the cavity, if the die has non-electrical material layer covering the second conductive contacts, the non-electrical material layer may be removed. At 910, a second conductive layer may be patterned and deposited on the first conductive layer and on the die or plurality of dies, wherein the second conductive layer includes a conductive structure, such as a via, a heat spreader, or a conductive plane, on the second surface of the die. In some embodiments, a seed layer may be deposited before depositing the second conductive layer. In some embodiments, the conductive structure on the second surface of the die may be electrically coupled to an individual second conductive contact. In some embodiments, the first and/or second conductive layers may be patterned and deposited using a photoresist material. A photoresist layer may be deposited, patterned by exposure to, for example, ultraviolet light, where non-masked regions for openings that correspond to the conductive structures. Conductive structures are formed by depositing conductive material, such as metal, in the openings by, for example, electrolytic plating. Once the conductive structures are formed, the photoresist material is removed, and if a seed is used, a light etch is performed to remove the seed layer. At 912, a dielectric layer may be formed over the first conductive layer, the second conductive layer, and the die, so that the die is embedded in the first conductive layer. At 914, the dielectric layer may be removed, for example, by planarization or grinding, to expose the top surface of the conductive structure.

Additional dielectric layers and conductive layers having a cavity for embedding a die or other conductive structures may be formed by repeating the process as described in 902 through 914. The finished substrate may be a single package substrate or may be a repeating unit that may undergo a singulation process in which each unit is separated for one another to create a single package substrate.

Other manufacturing technologies exist to make similar shaped vias. In an embodiment, the shaped via opening may be drilled using a RIE process that etches through a photoresist layer or a hard mask layer. Additionally, the shaped via openings may be drilled with a line shaped laser beam. For example, the laser beam may be shaped either optically or mechanically. The shaped laser beam may be steered and positioned (e.g., with a scanning system) to target locations where a shaped via opening is desired. According to an embodiment, the laser may be a pulsed $CO_2$ laser or a Q-switched UV laser. Embodiments may use the UV laser when relatively small shaped via dimensions are needed.

Another embodiment may use a laser beam to scan over a mask which has the shaped via pattern and is projected to the work piece. The fluence of the laser on the work piece may be sufficiently high to ablate the dielectric material and form the shaped via opening. By way of example, the lasers in such an embodiment may include Q-switched solid state UV lasers and excimer lasers. In embodiments that use either of the two previously described laser patterning processes to form the via openings, a photosensitive dielectric may not be used since the lasers themselves ablate the dielectric material and no exposure and developing processes may be performed.

Some methods disclosed may include forming the shaped via opening with a process that uses of a photosensitive dielectric. In such an embodiment, the photosensitive dielectric may be lithographically patterned and developed to form the shaped via openings. According to some embodiments, a post patterning cleaning process may also be included after the shaped via openings are formed. Embodiments may then include forming the shaped via in the opening with a metallization process, such as a semi-additive process (SAP).

The microelectronic assemblies disclosed herein may be used for any suitable application. For example, in some embodiments, a microelectronic assembly 100 may be used to provide an ultra-high density and high bandwidth interconnect for field programmable gate array (FPGA) transceivers and III-V amplifiers. For example, the die 114-1 may include FPGA transceiver circuitry or III-V amplifiers, and the die 114-2 may include FPGA logic.

In an example, the die 114-1 in a microelectronic assembly 100 may be a processing device (e.g., a central processing unit, a radio frequency chip, a power converter, a network processor, a graphics processing unit, a FPGA, a modem, an applications processor, etc.), and the die 114-2 may include high bandwidth memory, transceiver circuitry, and/or input/output circuitry (e.g., Double Data Rate transfer circuitry, Peripheral Component Interconnect Express circuitry, etc.).

In another example, the die 114-1 in a microelectronic assembly 100 may be a cache memory (e.g., a third level cache memory), and one or more dies 114-2 may be processing devices (e.g., a central processing unit, a radio frequency chip, a power converter, a network processor, a graphics processing unit, a FPGA, a modem, an applications processor, etc.) that share the cache memory of the die 114-1.

The microelectronic assemblies disclosed herein may be included in any suitable electronic component. FIGS. 10-14 illustrate various examples of apparatuses that may include, or be included in, any of the microelectronic assemblies disclosed herein.

Figure 10:
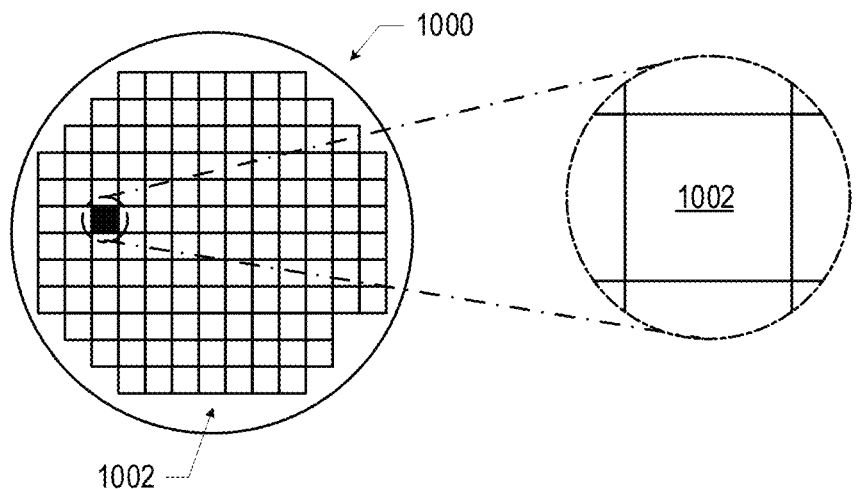
FIG. 10 is a top view of a wafer and dies that may be included in a microelectronic assembly, in accordance with any of the embodiments disclosed herein.

FIG. 10 is a top view of a wafer 1000 and dies 1002 that may be included in any of the microelectronic assemblies disclosed herein (e.g., any of the dies 114 disclosed herein). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 102/130 disclosed herein. The die 1002 may include one or more transistors (e.g., some of the transistors 1140 of FIG. 11, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 14) or other logic that is configured to store information in the memory devices or execute instructions stored in the memory array. Various ones of the microelectronic assemblies disclosed herein may be manufactured using a die-to-wafer assembly technique in which some dies are attached to a wafer 1000 that include others of the dies, and the wafer 1000 is subsequently singulated.

Figure 11:
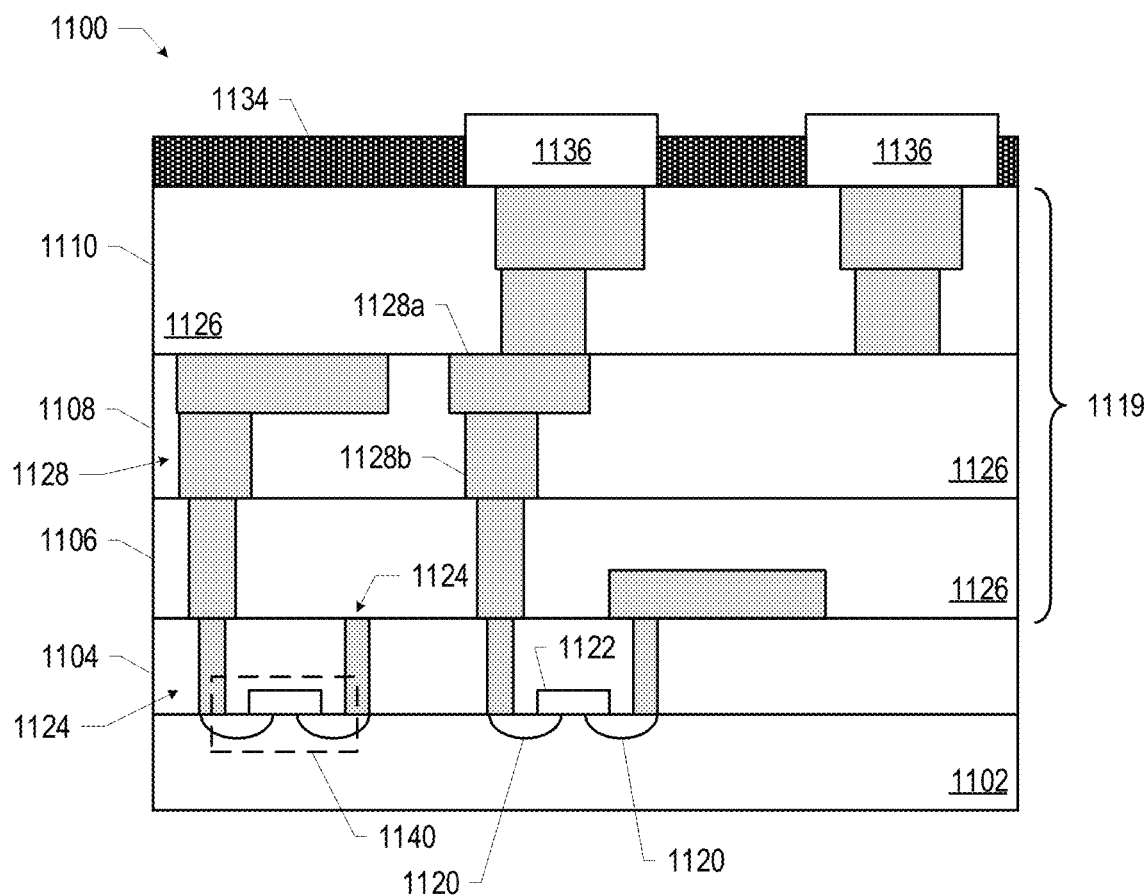
FIG. 11 is a cross-sectional side view of an integrated circuit device that may be included in a microelectronic assembly, in accordance with any of the embodiments disclosed herein.

FIG. 11 is a cross-sectional side view of an example IC device 1100 that may be included in any of the microelectronic assemblies disclosed herein (e.g., in any of the dies 114). One or more of the IC devices 1100 may be included in one or more dies 1002 (FIG. 10). The IC device 1100 may be formed on a substrate 1102 (e.g., the wafer 1000 of FIG. 10) and may be included in a die (e.g., the die 1002 of FIG. 10). The substrate 1102 may be a semiconductor substrate composed of semiconductor material systems including, for example, n-type or p-type materials systems (or a combination of both). The substrate 1102 may include, for example, a crystalline substrate formed using a bulk silicon or a silicon-on-insulator (SOI) substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1002 of FIG. 10) or a wafer (e.g., the wafer 1000 of FIG. 10).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106, 1108, and 1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 11. For example, the interconnect structures may be arranged as multidirectional interconnect structures. Although a particular number of interconnect layers 1106-1110 is depicted in FIG. 11, embodiments of the present disclosure include IC devices having more or fewer interconnect layers than depicted.

In some embodiments, the interconnect structures 1128 may include lines 1128*a* and/or vias 1128*b* filled with an electrically conductive material such as a metal. The lines 1128*a* may be arranged to route electrical signals in a direction of a plane that is substantially parallel with a surface of the substrate 1102 upon which the device layer 1104 is formed. For example, the lines 1128*a* may route electrical signals in a direction in and out of the page from the perspective of FIG. 11. The vias 1128*b* may be arranged to route electrical signals in a direction of a plane that is substantially perpendicular to the surface of the substrate 1102 upon which the device layer 1104 is formed. In some embodiments, the vias 1128*b* may electrically couple lines 1128*a* of different interconnect layers 1106-1110 together.

The interconnect layers 1106-1110 may include a dielectric material 1126 disposed between the interconnect structures 1128, as shown in FIG. 11. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128*a* and/or vias 1128*b*, as shown. The lines 1128*a* of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128*b* to couple the lines 1128*a* of the second interconnect layer 1108 with the lines 1128*a* of the first interconnect layer 1106. Although the lines 1128*a* and the vias 1128*b* are structurally delineated with a line within each interconnect layer (e.g., within the second interconnect layer 1108) for the sake of clarity, the lines 1128*a* and the vias 1128*b* may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components. The conductive contacts 1136 may serve as the conductive contacts 122 or 124, as appropriate.

In embodiments in which the IC device 1100 is a double-sided die (e.g., like the die 114), the IC device 1100 may include another metallization stack (not shown) on the opposite side of the device layer(s) 1104. This metallization stack, may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136. These additional conductive contacts may serve as the conductive contacts 122 or 124, as appropriate. Example details of a double-sided IC device are discussed in further detail in FIG. 12.

Figure 12:
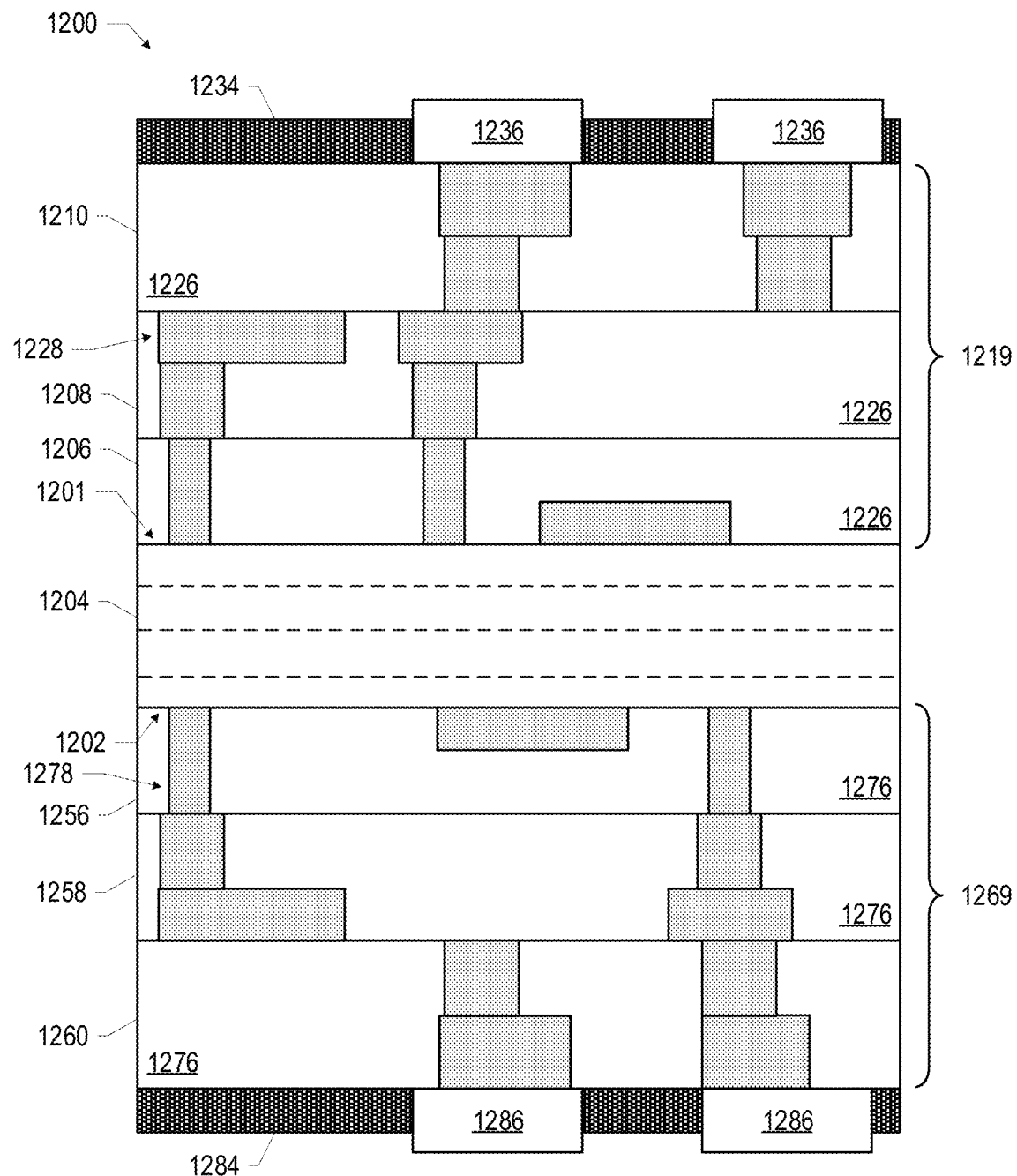
FIG. 12 is a cross-sectional side view of one example of a double-sided integrated circuit device that may be included in a microelectronic assembly, in accordance with any of the embodiments disclosed herein.

FIG. 12 is a side, cross-sectional view of one example type of a double-sided IC device 1200 that may be included in any of the microelectronic assemblies disclosed herein (e.g., in any of the dies 114). One or more of the double-sided IC devices 1200 may be included in one or more dies 1002 (FIG. 10). The double-sided IC device 1200 may be composed of semiconductor material systems including, for example, n-type or p-type materials systems (or a combination of both). In some embodiments, the IC device may be composed of alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the double-sided IC device 1200.

The double-sided IC device 1200 may include one or more device layers 1204. The device layers 1204 may include features of one or more transistors (e.g., as discussed in FIG. 11) and/or any other active and/or passive circuitry as may be desired by a device manufacturer.

Electrical signals, such as power and/or input/output (I/O) signals, may be routed to and/or from the devices of the device layers 1204 through one or more interconnect layers disposed on opposing sides of the device layers 1204 (illustrated in FIG. 12 as first interconnect layers 1206, 1208, and 1210 on a first side 1201 of the device layers and second interconnect layers 1256, 1258, and 1260 on an opposing second side 1202 of the device layers 1204). For example, electrically conductive features of the device layers 1204 may be electrically coupled with the first interconnect structures 1228 of the first interconnect layers 1206-1210 and/or with the second interconnect structures 1278 of the second interconnect layers 1256-1260. The one or more first interconnect layers 1206-1210 may form a first metallization stack (e.g., an ILD stack) 1219 and the one or more second interconnect layers 1256-1260 may form a second metallization stack 1269 of the double-sided IC device 1200.

The first interconnect structures 1228 may be arranged within the first interconnect layers 1206-1210 and the second interconnect structures 1278 may be arranged within the second interconnect layers 1256-1260 to route electrical signals according to a wide variety of designs (in particular, the arrangement is not limited to the particular configuration of the first interconnect structures 1228 and the second interconnect structures 1278 depicted in FIG. 12). For example, the first and/or second interconnect structures may be arranged as multidirectional interconnect structures. Although a particular number of first interconnect layers 1206-1210 and a particular number of second interconnect layers 1256-1260 are depicted in FIG. 12, embodiments of the present disclosure include IC devices having more or fewer first and/or second interconnect layers than depicted. Further, the particular number of first interconnect layers and second interconnect layers on opposing sides of the device layers 1204 may be the same or different from each other.

In some embodiments, the first interconnect structures 1228 and/or the second interconnect structures 1278 may include lines and/or vias as discussed herein filled with an electrically conductive material such as a metal. The first interconnect layers 1206-1210 may include a first dielectric material 1226 disposed between the first interconnect structures 1228, as shown in FIG. 12. In some embodiments, the first dielectric material 1226 disposed between the first interconnect structures 1228 in different ones of the first interconnect layers 1206-1210 may have different compositions; in other embodiments, the composition of the first dielectric material 1226 between different first interconnect layers 1206-1210 may be the same. The second interconnect layers 1256-1260 may include a second dielectric material 1276 disposed between the second interconnect structures 1278, as shown in FIG. 12. In some embodiments, the second dielectric material 1276 disposed between the second interconnect structures 1278 in different ones of the second interconnect layers 1256-1260 may have different compositions; in other embodiments, the composition of the second dielectric material 1276 between different second interconnect layers 1256-1260 may be the same. In some embodiments, the composition of the first dielectric material 1226 and the second dielectric material 1278 may be different; in other embodiments, the composition of the first dielectric material 1226 and the second dielectric material may be the same. The first interconnect layers 1206-1210 and the second interconnect layers 1256-1260 may be formed using any techniques as discussed herein (e.g., composed of M1-M3 layers, etc.).

The double-sided IC device 1200 may include a first solder resist material 1234 (e.g., polyimide or similar material) and one or more first conductive contacts 1236 formed on the first interconnect layers 1206-1210. The double-sided IC device 1200 may include a second solder resist material 1284 (e.g., polyimide or similar material) and one or more second conductive contacts 1286 formed on the second interconnect layers 1256-1260. In some embodiments, the composition of the first solder resist material 1234 and the second solder resist material 1284 may be the same; in other embodiments, the composition of the first solder resist material 1234 and the second solder resist material 1284 may be different.

In FIG. 12, the first conductive contacts 1236 and the second conductive contacts 1286 are illustrated as taking the form of bond pads. The first conductive contacts 1236 may be electrically coupled with the first interconnect structures 1228 and the second conductive contacts 1286 may be electrically coupled with the second interconnect structures 1278. In some embodiments, TSV interconnect structures may be integrated into the double-sided IC device 1200; in such embodiments, the first conductive contacts 1236 and the second conductive contacts 1286 may be electrically coupled via one or more TSV interconnect structures. The double-sided IC device 1200 may include additional or alternate structures to route the electrical signals from the first interconnect layers 1206-1210 and/or the second interconnect structures 1256-1260; for example, the first conductive contacts 1236 and/or the second conductive contacts 1286 may include other analogous features (e.g., posts) that route the electrical signals to external components. The conductive contacts 1236 and/or 1286 may serve as the conductive contacts 122 or 124, as appropriate.

Figure 13:
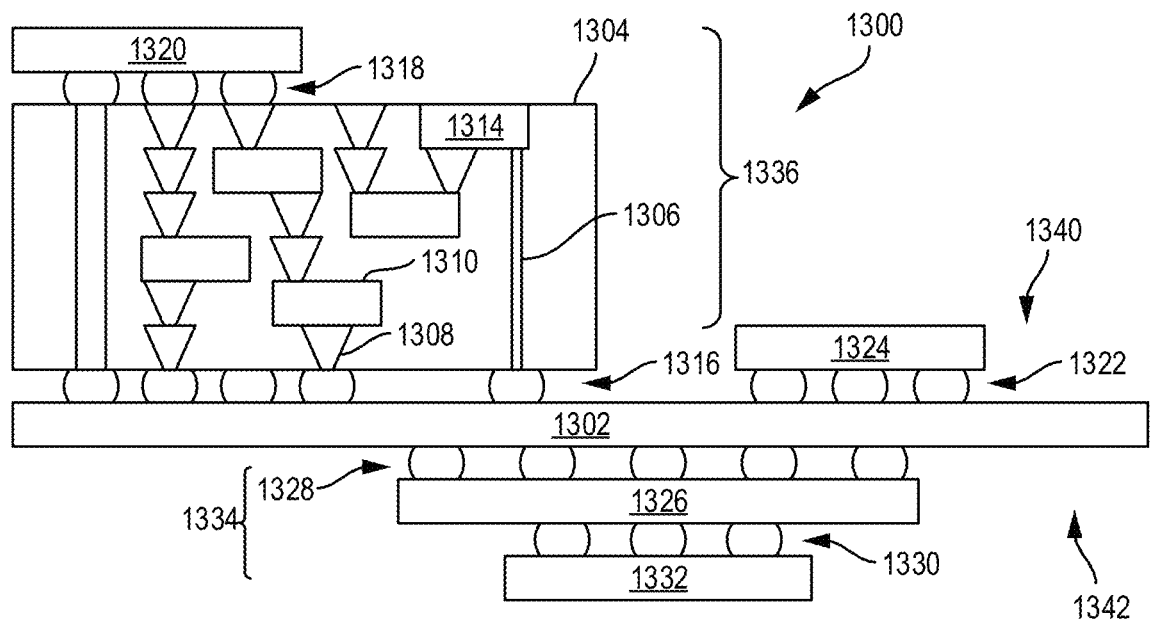
FIG. 13 is a cross-sectional side view of an integrated circuit device assembly that may include a microelectronic assembly, in accordance with any of the embodiments disclosed herein.

FIG. 13 is a cross-sectional side view of an IC device assembly 1300 that may include any of the microelectronic assemblies disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. Any of the IC packages discussed below with reference to the IC device assembly 1300 may take the form of any suitable ones of the embodiments of the microelectronic assemblies disclosed herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 13 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 13), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 13, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 10), an IC device (e.g., the IC device 1100 of FIG. 11 or the double-sided IC device 1200 of FIG. 12), or any other suitable component. Generally, the interposer 1304 may spread a connection to a wider pitch or reroute a connection to a different connection. For example, the interposer 1304 may couple the IC package 1320 (e.g., a die) to a set of ball grid array (BGA) conductive contacts of the coupling components 1316 for coupling to the circuit board 1302. In the embodiment illustrated in FIG. 13, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 13 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 14:
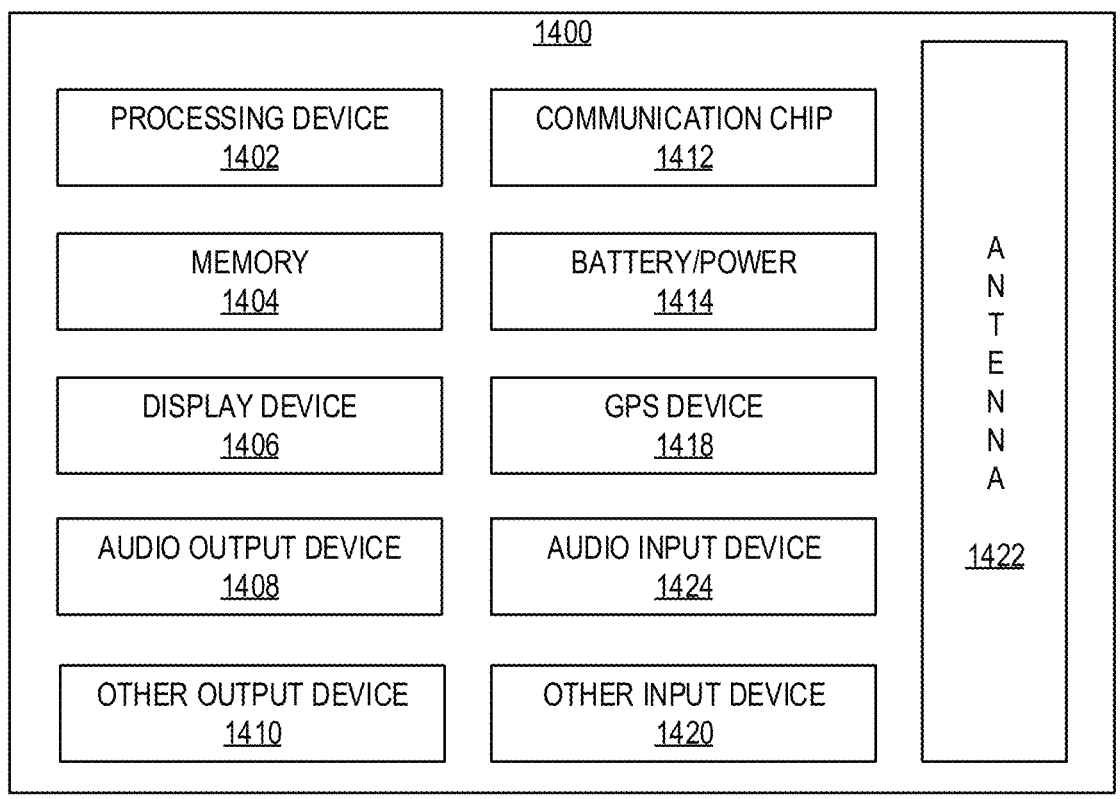
FIG. 14 is a block diagram of an example electrical device that may include a microelectronic, in accordance with any of the embodiments disclosed herein.

FIG. 14 is a block diagram of an example electrical device 1400 that may include one or more of the microelectronic assemblies disclosed herein. For example, any suitable ones of the components of the electrical device 1400 may include one or more of the IC device assemblies 1300, IC devices 1100, double-sided IC devices 1200 or dies 1002 disclosed herein, and may be arranged in any of the microelectronic assemblies disclosed herein. A number of components are illustrated in FIG. 14 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 14, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-MRAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1400 may be any other electronic device that processes data.

The following paragraphs provide various examples of the embodiments disclosed herein.

Example 1 is a microelectronic assembly, including: a package substrate; and a die having a first surface with first conductive contacts and an opposing second surface with second conductive contacts, wherein the die is embedded in the package substrate, and wherein the first and second conductive contacts are coupled to conductive pathways in the package substrate.

Example 2 may include the subject matter of Example 1, and may further specify that the die has a thickness between 10 um and 50 um.

Example 3 may include the subject matter of Example 1, and may further include: a channel in the package substrate.

Example 4 may include the subject matter of Example 3, and may further include: a fluid in the channel.

Example 5 may include the subject matter of Example 4, and may further specify that the fluid includes a coolant.

Example 6 may include the subject matter of Example 5, and may further specify that the coolant includes water.

Example 7 may include the subject matter of Example 3, and may further include: a heat spreader embedded in the package substrate.

Example 8 may include the subject matter of Example 7, and may further specify that the heat spreader provides at least a portion of a wall of the channel.

Example 9 may include the subject matter of Example 1, and may further include: a heat spreader, wherein the heat spreader is embedded in the package substrate.

Example 10 may include the subject matter of Example 9, and may further specify that the heat spreader is in contact with the second surface of the die.

Example 11 may include the subject matter of Example 1, and may further specify that the die is in an opening of a conductive plane in the package substrate, and wherein the conductive plane has a thickness that is greater than or equal to a thickness of the die.

Example 12 may include the subject matter of Example 1, and may further specify that the first conductive contacts are coupled to conductive pathways in the package substrate via first interconnects, and wherein the first interconnects include an anisotropic conductive material.

Example 13 may include the subject matter of Example 1, and may further specify that the second conductive contacts are coupled to conductive pathways in the package substrate via second interconnects, and wherein the second interconnects include a die attach film.

Example 14 may include the subject matter of Example 1, and may further specify that the first conductive contacts are coupled to conductive pathways in the package substrate via first interconnects, and wherein the first interconnects include solder.

Example 15 may include the subject matter of Example 1, and may further specify that the second conductive contacts are coupled to conductive pathways in the package substrate via second interconnects, and wherein the second interconnects include metal-to-metal interconnects.

Example 16 may include the subject matter of Example 1, and may further specify that the die is a central processing unit, a radio frequency chip, a power converter, or a network processor.

Example 17 may include the subject matter of any of Examples 1-16, and may further specify that the microelectronic assembly is included in a server device.

Example 18 may include the subject matter of any of Examples 1-16, and may further specify that the microelectronic assembly is included in a portable computing device.

Example 19 may include the subject matter of any of Examples 1-16, and may further specify that the microelectronic assembly included in a wearable computing device.

Example 20 is a microelectronic assembly, including: a package substrate, the package substrate including: a first dielectric layer having first conductive contacts on a first surface, a second dielectric layer having second conductive contacts on a second surface, and a conductive layer having a top surface and an opposing bottom surface, wherein the top surface of the conductive layer is in contact with the first surface of the first dielectric layer and the bottom surface of the conductive layer is in contact with the second surface of the second dielectric layer, and wherein the conductive layer includes a cavity having the second conductive contacts of the second dielectric layer at the bottom of the cavity; and a die having a first surface with first conductive contacts and an opposing second surface with second conductive contacts, wherein the die is embedded in the cavity in the conductive layer, and wherein the first conductive contacts on the first surface of the die are electrically coupled to the second conductive contacts on the second dielectric layer and the second conductive contacts on the second surface of the die are electrically coupled to the first conductive contacts on the first dielectric layer.

Example 21 may include the subject matter of Example 20, and may further include: a heat spreader within the first dielectric layer.

Example 22 may include the subject matter of Example 21, and may further include: a channel in the package substrate.

Example 23 may include the subject matter of Example 22, and may further include: a fluid in the channel.

Example 24 may include the subject matter of Example 23, and may further specify that the fluid includes a coolant.

Example 25 may include the subject matter of Example 24, and may further specify that the coolant includes water.

Example 26 may include the subject matter of Example 22, and may further specify that the heat spreader provides at least a portion of a wall of the channel.

Example 27 may include the subject matter of Example 20, and may further specify that the first conductive contacts on the first surface of the die are electrically coupled to the second conductive contacts on the second dielectric layer via first interconnects, and wherein the first interconnects include an anisotropic conductive material.

Example 28 may include the subject matter of Example 20, and may further specify that the first conductive contacts on the first surface of the die are electrically coupled to the second conductive contacts on the second dielectric layer via first interconnects, and wherein the first interconnects include a die attach film.

Example 29 may include the subject matter of Example 20, and may further specify that the first conductive contacts on the first surface of the die are electrically coupled to the second conductive contacts on the second dielectric layer via first interconnects, and wherein the first interconnects include metal-to-metal interconnects.

Example 30 may include the subject matter of Example 20, and may further specify that the first conductive contacts on the first surface of the die are electrically coupled to the second conductive contacts on the second dielectric layer via first interconnects, and wherein the first interconnects include solder.

Example 31 may include the subject matter of Example 20, and may further specify that the second conductive contacts on the second surface of the die are electrically coupled to the first conductive contacts on the first dielectric layer via second interconnects, and wherein the second interconnects include one or more of an anisotropic conductive material, a die attach film, metal-to-metal interconnects, and solder.

Example 32 may include the subject matter of Example 20, and may further specify that a thickness of the conductive layer is equal to a thickness of the die.

Example 33 may include the subject matter of Example 20, and may further specify that a thickness of the conductive layer is between 10 um and 50 um.

Example 34 is a method of manufacturing a microelectronic assembly, including: forming a package substrate portion, wherein the package substrate portion has a top surface with top conductive contacts and an opposing bottom surface having bottom conductive contacts; forming a first conductive layer on the top surface of the package substrate portion, wherein the first conductive layer includes a cavity; placing a die in the cavity, wherein the die has a first surface with first conductive contacts and an opposing second surface with second conductive contacts; forming first interconnects between the first conductive contacts of the die and the top conductive contacts of the package substrate portion; and forming a second conductive layer on the first conductive layer and on the die, wherein the second conductive layer includes a via on the second surface of the die that is electrically coupled to an individual second conductive contact.

Example 35 may include the subject matter of Example 34, and may further specify that forming the second conductive layer includes: depositing a photoresist layer on the first conductive layer and on the die; forming an opening in the photoresist layer; depositing conductive material in the opening to form the via; and removing the photoresist layer.

Example 36 may include the subject matter of Example 35, and may further specify that forming the second conductive layer includes: depositing a seed layer on the first conductive layer and on the die before depositing the photoresist layer.

Example 37 may include the subject matter of Example 34, and may further specify that placing the die in the cavity includes: positioning the die in the cavity while the die is coupled to a carrier; and removing the carrier.

Example 38 may include the subject matter of Example 34, and may further specify that the die is a first die, the first conductive layer further includes a second cavity, and the method further includes: placing a second die in the second cavity, wherein the second die has a first surface with first conductive contacts and an opposing second surface with second conductive contacts; and forming second interconnects between the first conductive contacts on the second die and the top conductive contacts on the package substrate portion.

Example 39 may include the subject matter of Example 34, and may further include: forming a third conductive layer on the dielectric layer, wherein the third conductive layer includes a third cavity, and wherein the dielectric layer includes top surface conductive contacts; placing a second die in the cavity, wherein the second die has a first surface with first conductive contacts and an opposing second surface with second conductive contacts; forming third interconnects between the first conductive contacts on the second die and the top surface conductive contacts on the dielectric layer; and forming a fourth conductive layer on the second conductive layer and on the second die, wherein the fourth conductive layer includes a second via on the second surface of the second die that is electrically coupled to an individual second conductive contact.

Example 40 may include the subject matter of any of Examples 34-39, and may further specify that the first interconnects include an anisotropic conductive material.

Example 41 may include the subject matter of any of Examples 34-39, and may further specify that the first interconnects include a die attach film.

Example 42 may include the subject matter of any of Examples 34-39, and may further specify that the first interconnects include metal-to-metal interconnects.

Example 43 may include the subject matter of any of Examples 34-39, and may further specify that the first interconnects include solder.

Example 44 may include the subject matter of any of Examples 34-39, and may further specify that a thickness of the first conductive layer is equal to or greater than a thickness of the die.

Example 45 may include the subject matter of Example 34, and may further specify that forming the second conductive layer further includes: forming a heat spreader on the second surface of the die.

Example 46 may include the subject matter of Example 45, and may further include: forming a channel, wherein the heat spreader provides at least a portion of a wall of the channel.

Example 47 is a method of manufacturing a microelectronic assembly, including: forming a portion of a package substrate, wherein the package substrate has a top surface with top conductive contacts and an opposing bottom surface having bottom conductive contacts; forming a first conductive layer on the top surface of the package substrate portion, wherein the first conductive layer includes a cavity; placing a die in the cavity, wherein the die has a first surface with first conductive contacts and an opposing second surface with second conductive contacts; forming first interconnects between the first conductive contacts of the die and the top conductive contacts of the package substrate portion; and forming a second conductive layer on the first conductive layer and on the die, wherein the second conductive layer includes a conductive structure on the second surface of the die.

Example 48 may include the subject matter of Example 47, and may further specify that the conductive structure is a heat spreader.

Example 49 may include the subject matter of Example 47, and may further specify that the conductive structure is a via, and wherein the via is electrically coupled to an individual second conductive contact on the die.

Example 50 may include the subject matter of Example 47, and may further specify that the conductive structure is a conductive plane.

The invention claimed is:

1. A microelectronic assembly, comprising:
   a package substrate including a plurality of layers, wherein the plurality of layers include a first layer, a second layer, a third layer, and a fourth layer;
   a die having a first surface with first conductive contacts and an opposing second surface with second conductive contacts, wherein the die is embedded in the first layer of the package substrate, and wherein the first and second conductive contacts are coupled to conductive pathways in the package substrate;
   a heat spreader in the second layer of the package substrate, wherein the second layer is on the first layer and the heat spreader is in contact with the second surface of the die;
   a conductive plane in the third layer of the package substrate, wherein the third layer is on the second layer and the conductive plane is in contact with the heat spreader; and
   a channel in the fourth layer of the package substrate, wherein the fourth layer is on the third layer, and wherein the conductive plane provides at least a portion of a wall of the channel.

2. The microelectronic assembly of claim 1, wherein the die has a thickness between 10 um and 50 um.

3. The microelectronic assembly of claim 1, wherein the channel is one of a plurality of channels.

4. The microelectronic assembly of claim 1, further comprising:
   a fluid in the channel.

5. The microelectronic assembly of claim 4, wherein the fluid includes a coolant.

6. The microelectronic assembly of claim 5, wherein the coolant includes water.

7. The microelectronic assembly of claim 4, further comprising:
   a pump for circulating the fluid through the channel.

8. The microelectronic assembly of claim 1, wherein the die is a first die, and the microelectronic assembly further comprising:
   a second die embedded in a fifth layer of the package substrate, wherein the fifth layer is below the first layer, and wherein the second die at least partially overlaps the first die.

* * * * *